United States Patent
Arai et al.

(10) Patent No.: US 9,094,021 B2
(45) Date of Patent: Jul. 28, 2015

(54) SEMICONDUCTOR DEVICE AND VARIATION INFORMATION OBTAINING PROGRAM

(71) Applicant: Renesas Electronics Corporation, Kawasaki-shi, Kanagawa (JP)

(72) Inventors: Chihiro Arai, Kanagawa (JP); Toshiya Uozumi, Kanagawa (JP); Keisuke Ueda, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 80 days.

(21) Appl. No.: 13/783,329

(22) Filed: Mar. 3, 2013

(65) Prior Publication Data

US 2013/0257547 A1    Oct. 3, 2013

(30) Foreign Application Priority Data

Mar. 30, 2012  (JP) .................. 2012-082768

(51) Int. Cl.
*H03L 7/08*   (2006.01)
*H03L 1/00*   (2006.01)
(Continued)

(52) U.S. Cl.
CPC .. *H03L 7/06* (2013.01); *H03L 1/00* (2013.01); *H03L 7/099* (2013.01); *H03L 2207/06* (2013.01)

(58) Field of Classification Search
CPC .............. H03B 5/04; H03B 5/08; H03B 5/12; H03B 5/1206; H03B 5/1212; H03B 5/1215; H03B 5/1228; H03B 5/1231; H03B 5/124; H03B 5/1265; H03B 5/1271; H03B 2201/036; H03L 1/00; H03L 7/08; H03L 7/0805; H03L 7/087

USPC .......... 327/156; 331/16–18, 44, 105, 117 FE, 331/117 R, 167, 175, 176, 185, 186; 375/373–376
See application file for complete search history.

(56) References Cited

U.S. PATENT DOCUMENTS

| 5,952,892 A * | 9/1999 | Szajda ........................... 331/57 |
| 6,624,706 B2 * | 9/2003 | Higashi et al. ................... 331/17 |

(Continued)

FOREIGN PATENT DOCUMENTS

| JP | 2002-359289 A | 12/2002 |
| JP | 2007-251228 A | 9/2007 |

(Continued)

OTHER PUBLICATIONS

Office Action in related Japanese Patent Application No. 2012-082768 (mailed Jan. 20, 2015), citing Foreign Patent Documents 1, 2 and 3.

*Primary Examiner* — Levi Gannon
(74) *Attorney, Agent, or Firm* — Miles & Stockbridge P.C.

(57) ABSTRACT

A conventional semiconductor device has a problem that acquisition of variation information of circuit elements constructing the semiconductor device is not easy. According to an embodiment, a semiconductor device has a control circuit which makes an oscillation circuit operate by at least two operation current values, obtains first frequency information related to frequency of an output signal corresponding to a first operation current value and second frequency information related to frequency of an output signal corresponding to a second operation current value, and obtains manufacture variation information of a circuit element on the basis of the difference between the first and second frequency information.

16 Claims, 16 Drawing Sheets

(51) Int. Cl.
  *H03B 5/04* (2006.01)
  *H03B 5/12* (2006.01)
  *H03L 7/06* (2006.01)
  *H03L 7/099* (2006.01)

(56) References Cited

U.S. PATENT DOCUMENTS

| | | | |
|---|---|---|---|
| 6,680,655 B2 * | 1/2004 | Rogers | 331/109 |
| 6,683,502 B1 * | 1/2004 | Groen et al. | 331/17 |
| 6,770,949 B1 * | 8/2004 | Eltoukhy | 257/536 |
| 6,853,177 B2 | 2/2005 | Shibayama et al. | |
| 6,870,411 B2 * | 3/2005 | Shibahara et al. | 327/156 |
| 7,095,288 B2 * | 8/2006 | Smith | 331/74 |
| 7,301,414 B2 * | 11/2007 | Hino | 331/179 |
| 7,586,379 B2 | 9/2009 | Shimizu | |
| 7,592,877 B2 * | 9/2009 | Shiramizu et al. | 331/57 |
| 7,616,067 B2 * | 11/2009 | Matsumoto et al. | 331/16 |
| 7,986,175 B2 * | 7/2011 | Ebuchi et al. | 327/147 |

FOREIGN PATENT DOCUMENTS

| | | |
|---|---|---|
| JP | 2008-124687 A | 5/2008 |
| JP | 2011-23938 A | 2/2011 |

* cited by examiner

SEMICONDUCTOR DEVICE AND VARIATION INFORMATION OBTAINING PROGRAM

CROSS-REFERENCE TO RELATED APPLICATIONS

The disclosure of Japanese Patent Application No. 2012-082768 filed on Mar. 30, 2012 including the specification, drawings and abstract is incorporated herein by reference in its entirety.

The present invention relates to a semiconductor device and a variation information obtaining program and relates to, for example, a semiconductor device having an oscillator and a variation information obtaining program for the same.

BACKGROUND

In recent years, for a wireless integrated circuit used for a wireless LAN (Local Area Network) or the like, a demand for miniaturizing the entire system by integrating a baseband function and a wireless function on one chip is increasing. In the case of increasing the integration degree of a semiconductor chip, increase in the chip area has to be suppressed by using microfabrication process. However, in the case of using microfabrication process, problems such as large variations in the threshold of a transistor and large variation in circuit characteristics occur. To address the problems, patent literature 1 discloses a technique of suppressing variations in a jitter value caused by manufacture variations in a PLL circuit. In the patent literature 1, variations in a jitter value are suppressed by using a gain adjustment circuit for adjusting the gain of a voltage controlled oscillator in a PLL circuit and an offset adjustment circuit for stopping an offset control signal for controlling the oscillation frequency of an output signal of the voltage controlled oscillator when a control voltage of a predetermined value is applied to become a target value.

BACKGROUND ART LITERATURE

Patent Literature

Patent Literature 1: Japanese Unexamined Patent Application Publication No. 2008-124687

SUMMARY

In the technique described in the patent literature 1, however, although the gain adjustment circuit and the offset adjustment circuit are provided for suppressing a jitter value of an output signal of the PLL circuit, those circuits have to be optimized in order to grasp a variation value of a transistor. That is, the technique disclosed in the patent literature 1 has a problem that it is difficult to grasp the variation value of the transistor as a component of the PLL circuit. The other problems and the novel features will become apparent from the description of the specification and the appended drawings.

According to an embodiment, a semiconductor device and a variation information obtaining program has a control circuit which makes an oscillation circuit operate by at least two operation current values, obtains first frequency information related to frequency of an output signal corresponding to a first operation current value and second frequency information related to frequency of an output signal corresponding to a second operation current value, and obtains manufacture variation information of a circuit element on the basis of the difference between the first and Second frequency information.

In the embodiment, the semiconductor device and the variation information obtaining program can grasp manufacture variations in the transistor.

DETAILED DESCRIPTION

First Embodiment

Hereinafter, embodiments will be described with reference to the drawings. First, a semiconductor device to be described later obtains information of manufacture variations of transistors in the semiconductor device from information regarding the frequency of an output signal of an oscillation circuit. The obtained variation information is supplied to various circuits in the semiconductor device, and correcting process based on the variation information is performed in each of the circuits. In the first embodiment, operation current of the oscillation circuit used to specify variation information as an object to be corrected is an object to be corrected. However, a parameter which can be corrected on the basis of the variation information is not limited to the operation current.

Figure 1:
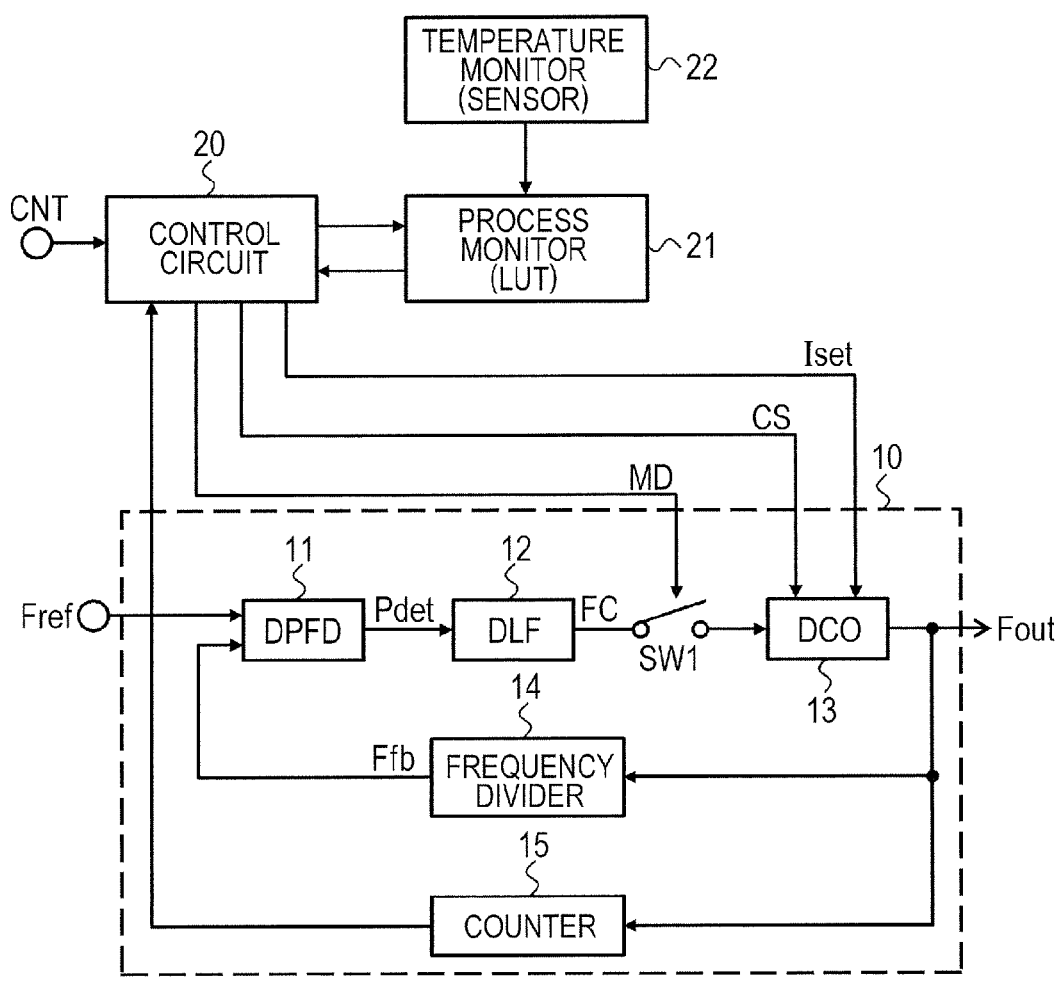
FIG. 1 is a block diagram of a semiconductor device according to a first embodiment.

FIG. 1 is a block diagram of a semiconductor device 1 according to the first embodiment. As illustrated in FIG. 1, the semiconductor device 1 has an oscillation circuit 10, a control circuit 20, a process monitor 21, and a temperature monitor 22.

The oscillation circuit 10 outputs an output signal Fout having a predetermined frequency. More concretely, the oscillation circuit 10 is a PLL (Phase Locked Loop) circuit and outputs an output signal having a frequency which is set in the PLL circuit. In the example illustrated in FIG. 1, the oscillation circuit 10 has a phase comparator 11, a filter circuit 12, a digital control oscillator 13, a frequency divider 14, a counter 15, and a switch circuit SW1.

The phase comparator 11 outputs a phase difference detection value Pdet having the magnitude according to the phase difference between a reference signal Fref and a feedback signal Ffb generated from the output signal Fout. The filter circuit 12 performs filter process on the phase difference detection value Pdet to generate a frequency control value FC. The digital control oscillator 13 controls the frequency of the output signal Fout in accordance with the frequency control value FC. To the digital control oscillator 13, a capacitance selection value CS is supplied. The digital control oscillator 13 performs coarse adjustment of the oscillation frequency of the output signal Fout in accordance with the magnitude of the capacitance selection value CS and performs fine adjustment of the frequency of the output signal Fout by the frequency control value FC. That is, the digital control oscillator 13 sets a frequency band of the output signal Fout by the capacitance selection value CS and performs high-precision frequency control in the frequency band by the frequency control value FC. The frequency divider 14 divides the frequency of the output signal Fout to generate the feedback signal Ffb. The switch circuit SW1 is provided between the filter circuit 12 and the digital control oscillator 13. The switch circuit SW1 is switched between a conduction state and a shutoff state in accordance with an operation mode switch signal MD which is output from the control circuit 20.

The counter 15 generates a count value according to the frequency of the output signal Fout and supplies it to the control circuit 20. As the counter 15, for example, a counter used in a PLL circuit of a two-point modulation scheme can be used, which is described in Akamine Y., Kawabe M., Hori K., Okazaki T., Kasahara N., and Tanaka S., "ΔΣ PLL Transmitter With a Loop-Bandwidth Calibration System", IEEE Journal of Solid-State Circuits, Volume 43, Issue 2, pp. 497-506, 2008. That is, as the counter 15, a counter used for another use can be commonly used. It is unnecessary to provide a counter particularly for the semiconductor device 1 of the first embodiment.

The control circuit 20 switches a current set value Iset for switching the operation current of the oscillation circuit 10 between a first current value and a second current value. The control circuit 20 obtains first frequency information on the frequency of the output signal Fout in a state where the operation current of the oscillation circuit 10 is sot to the first current value and second frequency information on the frequency of the output signal Fout in a state where the operation current is set to the second current value. After that, the control circuit 20 obtains the manufacture variation information of the transistor as a component of the oscillation circuit Fout on the basis of the difference value between the first and second frequency information. The control circuit 20 performs the control on the operation of the oscillation circuit 10 and the process of obtaining the variation information in accordance with a control signal CNT supplied from another circuit (not illustrated) formed on the outside or the same semiconductor substrate.

In the period of obtaining the first and second frequency information, the control circuit 20 sets the switch circuit SW1 to the shutoff state, thereby stopping the transmission of the frequency control value FC to the digital control oscillator 13 in accordance with the operation mode switch signal MD. The control circuit 20 outputs the capacitance selection value CS designating the capacitance value of variable capacitance (for example, a frequency band setting part 30) of the digital control oscillator 13 which will be described later. The control circuit 20 sets the capacitance value of the variable capacitance of the capacitance selection value CS so that the frequency of the output signal Fout becomes the maximum in the period of obtaining the first and second frequency information.

The temperature monitor 22 is a temperature sensor formed on the same substrate as that of the semiconductor device, and outputs temperature information corresponding to the temperature of the semiconductor substrate. The temperature information may be obtained from the outside of the semiconductor device. For example, in the case of obtaining the temperature information, the temperature of the system in which the semiconductor device is mounted may be obtained.

The process monitor 21 is a look-up table having table information indicating the relation between a variation amount of a circuit element (for example, a transistor) as a component of the oscillation circuit and the difference value. The process monitor 21 has a plurality of pieces of table information and switches table information to be used in accordance with the temperature information obtained from the temperature monitor 22. The control circuit 20 obtains manufacture variation information (for example, a variation amount) of a transistor corresponding to the difference value of the frequency information with reference to the process monitor 21 and corrects the current set value Iset used for the oscillating operation of the oscillation circuit in accordance with the obtained variation amount.

Figure 2:
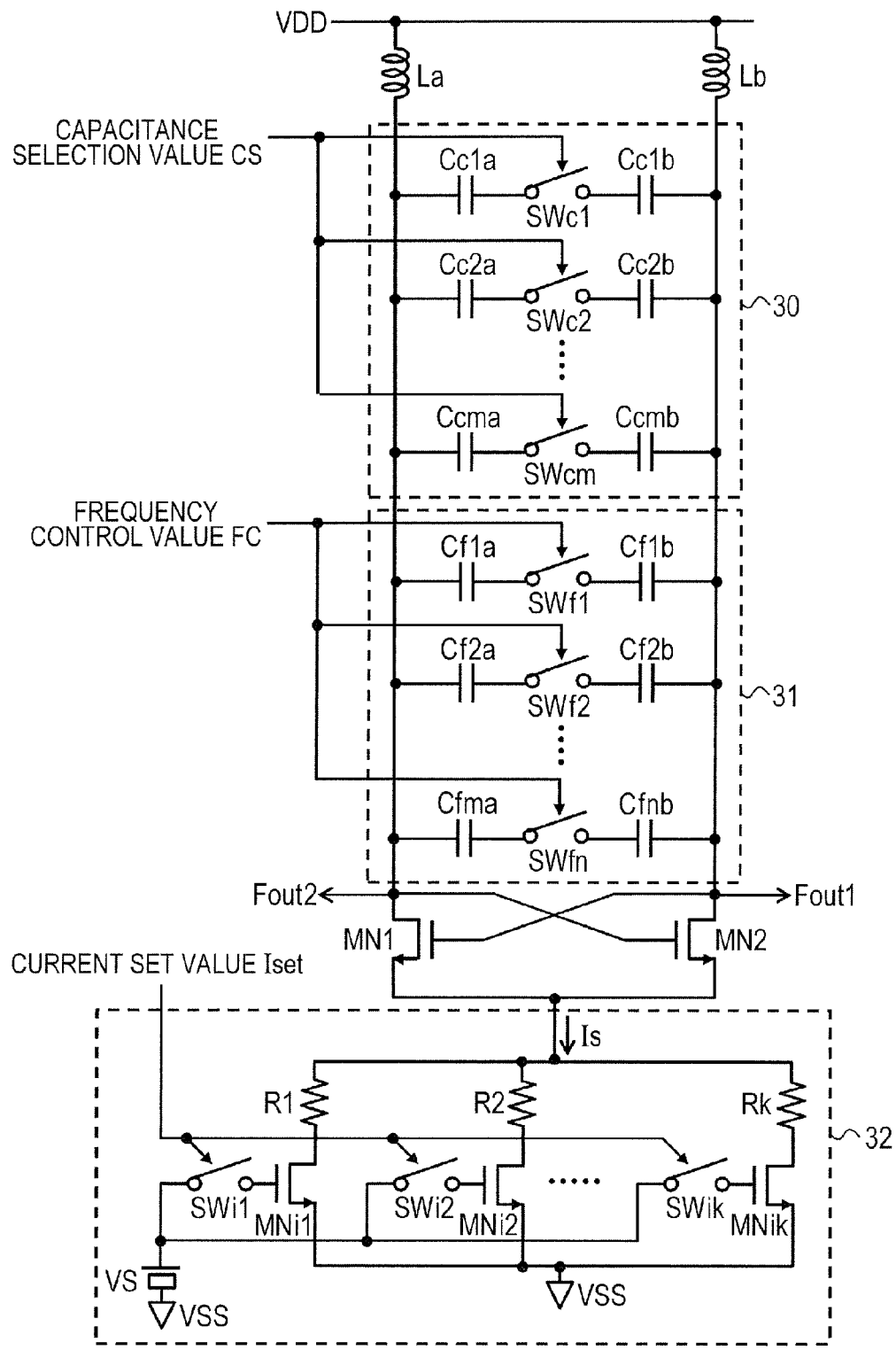
FIG. 2 is a circuit diagram of an oscillator in the first Embodiment.

The details of the digital control oscillator 13 will now be Described. FIG. 2 is a detailed circuit diagram of the digital control oscillator 13. As illustrated in FIG. 2, the digital control oscillator 13 has NMOS transistors MN1 and MN2, inductors La and Lb, the frequency band setting unit 30, a frequency adjusting unit 31, and a variable current source 32. As illustrated in FIG. 2, the digital control oscillator 13 outputs a difference signal including output signals Fout1 and Fout2 as the output signal Fout. The frequency band setting unit 30 and the frequency adjusting unit 31 are circuits functioning as variable capacitance.

The sources of the NMOS transistors MN1 and MN2 are commonly connected, and operation current Is is supplied to the common connection point. The variable current source 32 which outputs the operation current Is is connected between the common connection point of the NMOS transistors MN1 and MN2 and the ground terminal. To the ground terminal, ground voltage VSS is supplied.

The gate of the NMOS transistor MN1 is connected to the drain of the NMOS transistor MN2. The gate of the NMOS transistor MN2 is connected to the drain of the NMOS transistor MN1. The output signal Fout2 is output from the drain of the NMOS transistor MN1. The output signal Fout1 is output from the drain of the NMOS transistor MN2. The drain of the NMOS transistor MN1 is connected to the power supply terminal via an inductor La. The drain of the NMOS transistor MN2 is connected to the power supply terminal via an inductor Lb. Power supply voltage VDD is supplied to the power supply terminal.

The frequency band setting unit 30 and the frequency adjusting unit 31 are connected between the drain of the NMOS transistor MN1 and the drain of the NMOS transistor MN2. The frequency band setting unit 30 switches the capacitance value between the drain of the NMOS transistor MN1 and the drain of the NMOS transistor MN2 on the basis of the capacitance selection value CS. The frequency band setting unit 30 has capacitors Cc1a to Ccma, capacitors Cc1b to Ccmb, and switches SWc1 to SWcm. "m" denotes an integer indicative of the number of capacitors or switches. The capacitors Cc1a and Cc1b are connected in series between the drain of the NMOS transistor MN1 and the drain of the NMOS transistor MN2. The capacitors Cc1a and Cc1b are connected to each other via the switch SWc1. The capacitors Cc2a and Cc2b are connected in series between the drain of the NMOS transistor MN1 and the drain of the NMOS transistor MN2. The capacitors Cc2a and Cc2b are connected to each other via the switch SW2. The capacitors Ccma and Ccmb are connected in series between the drain of the NMOS transistor MN1 and the drain of the NMOS transistor MN2. The capacitors Ccma and Ccmb are connected to each other via the switch SWcm. That is, the frequency band setting unit 30 has "m" sets each made of two capacitors having the same circuit configuration and one switch. The capacitance selection value CS is supplied to the switches SWc1 to SWcm. The number of switches which enter the conductive state in the switches SWc1 to SWcm is switched according to the magnitude of the capacitance selection value CS.

The adjusting unit 31 switches the capacitance value between the drain of the NMOS transistor MN1 and the drain of the NMOS transistor MN2 on the basis of the frequency control value FC. The frequency adjusting unit 31 has capacitors Cf1a to Cfna, capacitors Cf1b to Cfnb, and switches SWf1 to SWfn. "n" denotes an integer indicative of the number of capacitors or switches. The capacitors Cf1a and Cf1b are connected in series between the drain of the NMOS transistor MN1 and the drain of the NMOS transistor MN2. The capacitors Cf1a and Cf1b are connected to each other via the switch SWf1. The capacitors Cf2a and Cf2b are connected in series between the drain of the NMOS transistor MN1 and the drain of the NMOS transistor MN2. The capacitors Cf2a and Cf2b are connected to each other via the switch SWf2. The capacitors Cfna and Cfnb are connected in series between the drain of the NMOS transistor MN1 and the drain of the NMOS transistor MN2. The capacitors Cfna and Cfnb are connected to each other via the switch SWfn. That is, the frequency adjusting unit 31 has "n" sets each made of two capacitors having the same circuit configuration and one switch. The frequency control value FC is supplied to the switches SWf1 to SWfn. The number of switches which enter the conductive state in the switches SWf1 to SWfn is switched according to the magnitude of the frequency control value FC.

Each of the frequency band setting unit 30 and the frequency adjusting unit 31 has capacitors. The capacitors are set so that the capacitance value of the capacitor in the frequency band setting unit 30 is larger than that of the capacitor in the frequency adjusting unit 31. With such setting, by varying the capacitance value of the frequency band setting unit 30, the oscillation frequency is switched and, by varying the capacitance value of the frequency adjusting unit 31, fine adjustment of the oscillation frequency can be realized.

The variable current source 32 has NMOS transistors MNi1 to MNik, switches SWi1 to SWik, resistors R1 to Rk, and a constant voltage source VS. "k" denotes an integer indicative of the number of components. The source of the NMOS transistor MNi1 is connected to the ground terminal. The drain of the NMOS transistor MNi1 is connected to the common connection point of the NMOS transistors MN1 and MN2 via the resistor R1. The gate of the NMOS transistor MNi1 is connected to the constant voltage source VS via the switch SWi1. The source of the NMOS transistor MNi2 is connected to the ground terminal. The drain of the NMOS transistor MNi2 is connected to the common connection point of the NMOS transistors MN1 and MN2 via the resistor R2, The gate of the NMOS transistor MNi2 is connected to the constant voltage source VS via the switch SWi2. The source of the NMOS transistor MNik is connected to the ground terminal. The drain of the NMOS transistor MNik is connected to the common connection point of the NMOS transistors MN1 and MN2 via the resistor Rk. The gate of the NMOS transistor MNik is connected to the constant voltage source VS via the switch SWik.

To the switches SWi1 to SWik, the current set value Iset is supplied. The number of switches which enter the conductive state in the switches SWi1 to SWik is switched according to the current set value Iset. The number of NMOS transistors which enter the conductive state in the NMOS transistors MNi1 to MNik increases as the number of switches which enter the on state in the switches SWi1 to SWik increases. As the number of transistors increases, the operation current Is increases.

Figure 3:
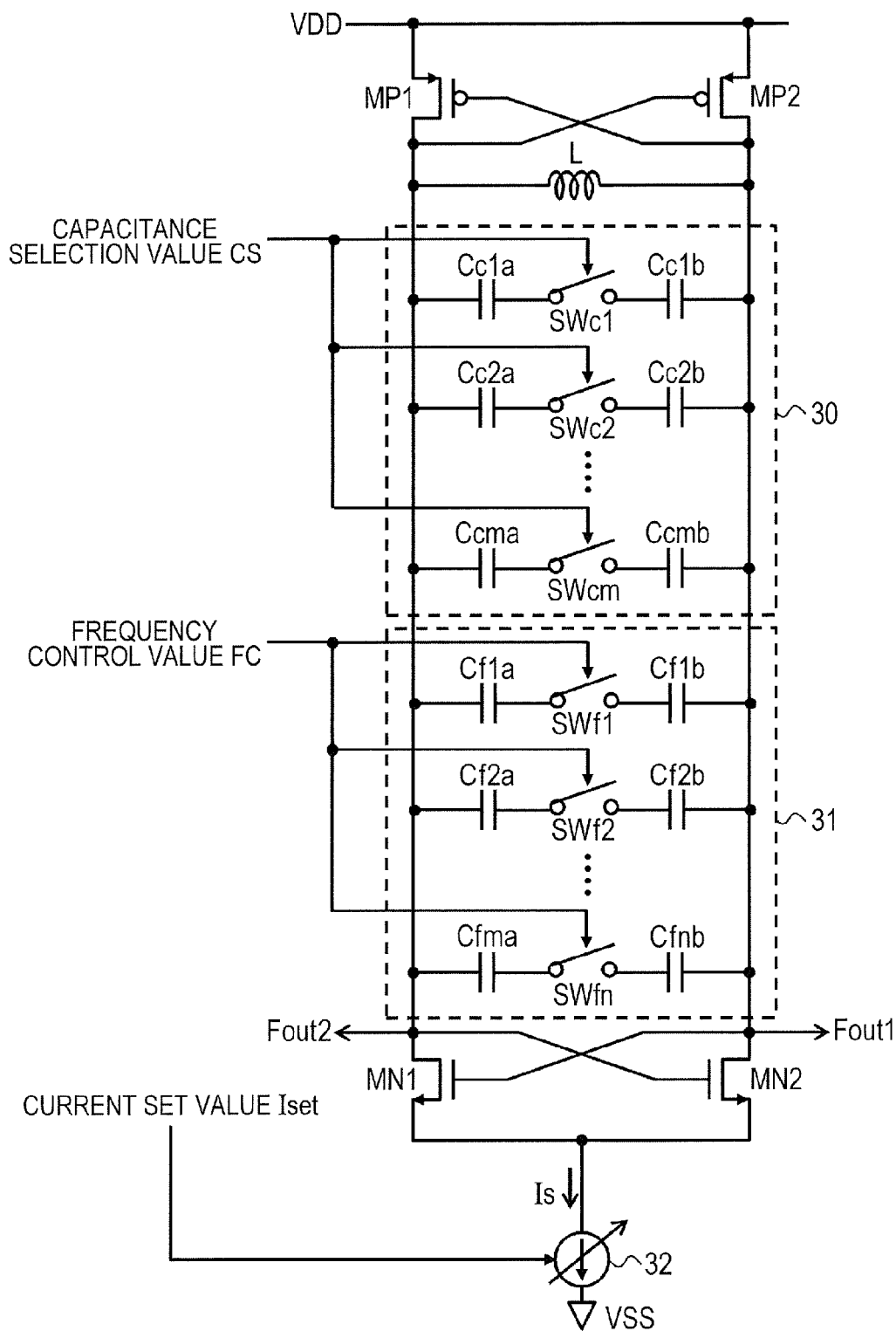
FIG. 3 is a diagram illustrating a modification of the oscillator in the first embodiment.

The digital control oscillator 13 can be realized also by circuits other than the circuits illustrated in FIG. 2. FIG. 3 is a circuit diagram of a digital control oscillator 13a as a modification of the digital control oscillator 13 illustrated in FIG. 2.

The digital control oscillator 13a illustrated in FIG. 3 is constructed by CMOS process using NMOS transistors and PMOS transistors. The digital control oscillator 13a has, in place of the inductors La and Lb, an inductor L and PMOS transistors MP1 and MP2. The inductor L is connected between the drain of the NMOS transistor MN1 and the drain of the NMOS transistor MN2.

The drain of the PMOS transistor MP1 is connected to the drain of the NMOS transistor MN1. The source of the PMOS transistor MP1 is connected to the power supply terminal. The gate of the PMOS transistor 1 is connected to the drain of the PMOS transistor MP2. The drain of the PMOS transistor MP2 is connected to the drain of the NMOS transistor MN2. The source of the PMOS transistor MP2 is connected to the power supply terminal. The gate of the PMOS transistor MP2 is connected to the drain of the PMOS transistor MP1.

The digital control oscillator 13a employs a positive load circuit in the load portion of the digital control oscillator and can perform the same operation as that of the digital control oscillator 13.

Figure 4:
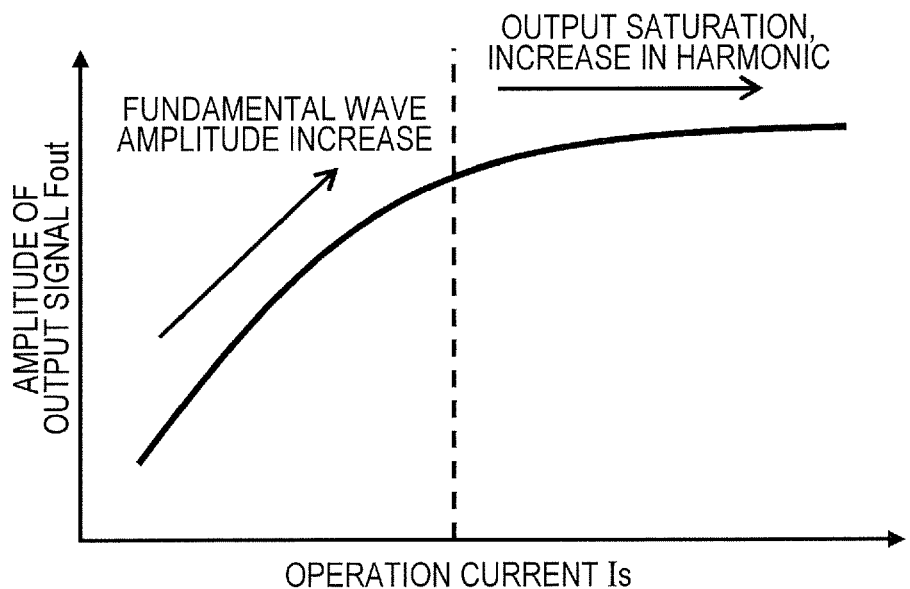
FIG. 4 is a graph illustrating the relation between the operation current of the oscillator in the first embodiment and the amplitude of an output signal.

Subsequently, the operation characteristic of the digital control oscillator 13 will be described. FIG. 4 is a graph illustrating the relation between the operation current Is of the digital control oscillator 13 in the first embodiment and the amplitude of the output signal Fout. As illustrated in FIG. 4, the amplitude of the digital control oscillator 13 increases as the operation current Is increases. After the operation current Is reaches predetermined magnitude, increase in the amplitude saturates, and harmonic components increase.

Figure 5:
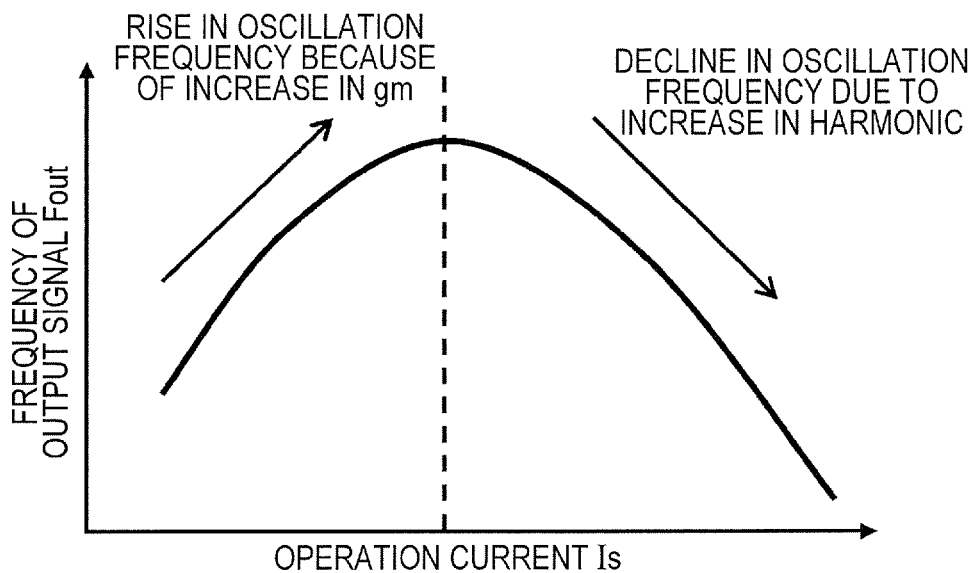
FIG. 5 is a graph illustrating the relation between the operation current of the oscillator in the first embodiment and the frequency of an output signal.

FIG. 5 is a graph illustrating the relation between the operation current IS of the digital control oscillator 13 in the first embodiment and the frequency of the output signal Fout. As illustrated in FIG. 5, the frequency of the digital control oscillator 13 rises as the operation current Is increases. After the operation current Is reaches predetermined magnitude, the frequency of the output signal Fout changes to decrease. The decrease in the frequency is caused by increase in the harmonic components. That is, the magnitude of the operation current Is at which the frequency changes to decrease is equal to that of the operation current Is at which the amplitude of the output signal Fout saturates.

Figure 6:
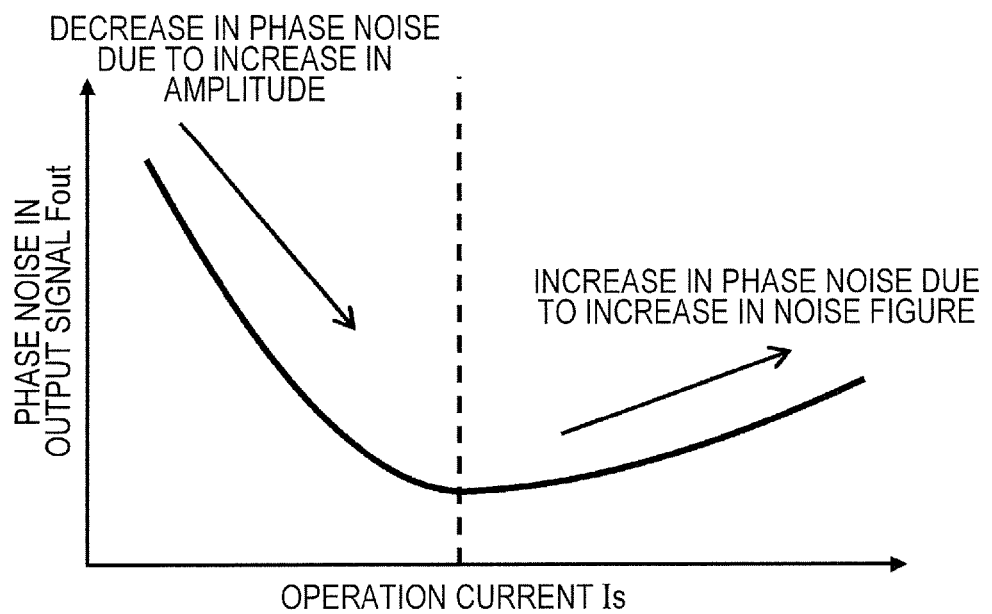
FIG. 6 is a graph illustrating the relation between the operation current of the oscillator in the first embodiment and phase noise of an output signal.

FIG. 6 is a graph illustrating the relation between the operation current Is of the digital control oscillator 13 in the first embodiment and phase noise of an output signal Fout. As illustrated in FIG. 6, in the digital control oscillator 13, phase noise decreases as the operation current Is increases. After the operation current Is reaches predetermined magnitude, phase noise in the output signal Fout changes to increase. The increase in the phase noise is caused by increase in the harmonic components or noise figure of noise or the like overlapped on the operation current. That is, the magnitude of the operation current Is at which the frequency changes to decrease is equal to that of the operation current Is at which the amplitude of the output signal Fout saturates.

Figure 7:
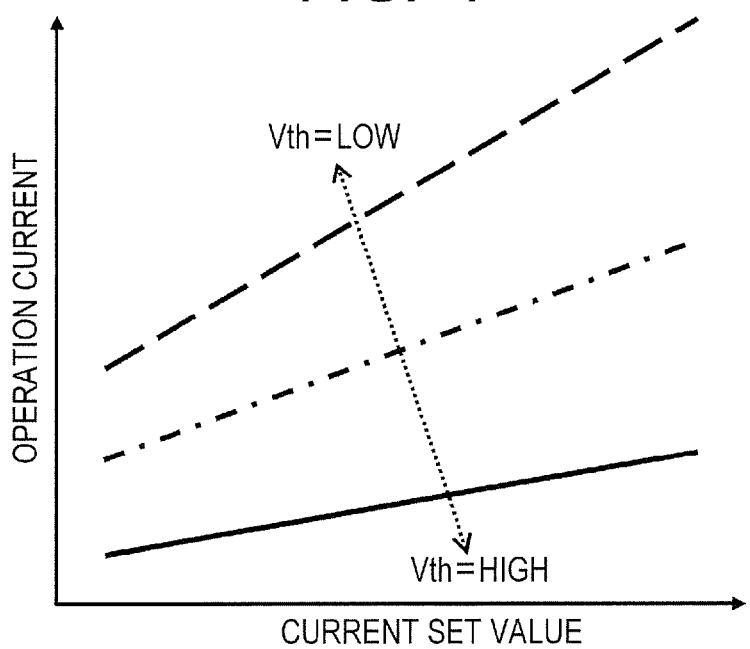
FIG. 7 is a graph illustrating the relation between a current set value of the oscillator in the first embodiment and the magnitude of operation current.

FIG. 7 is a graph illustrating the relation between the current set value Iset of the digital control oscillator 13 in the first embodiment and the magnitude of the operation current Is. As illustrated in FIG. 7, in the digital control oscillator 13, the operation current Is increases as the magnitude of the current set value increases. The magnitude of the operation current Is varies according to variation in threshold voltage Vth of transistors. More concretely, when the threshold voltage Vth of the NMOS transistors MN1 and MN2 becomes low and various, the operation current Is increases. When the threshold voltage Vth becomes high and various, the operation current Is decreases. This is because the resistance value of the NMOS transistors MN1 and MN2 and the variable current source 32 determines the consumption current of the digital control oscillator 13.

Figure 8:
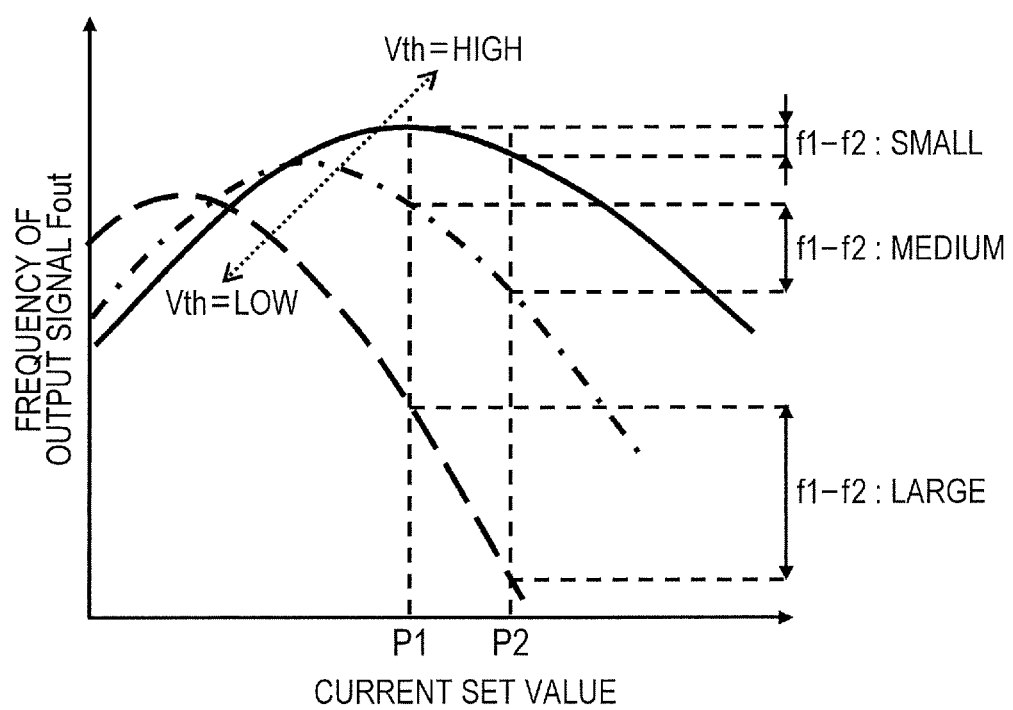
FIG. 8 is a graph illustrating the relation between the current set value of the oscillator in the first embodiment and the frequency of an output signal.

As described with reference to FIGS. 4 to 7, in the digital control oscillator 13, the operation current Is changes according to the magnitude of the current set value Iset. According to fluctuation in the operation current Is, the amplitude, frequency, and phase noise of the output signal Fout change. FIG. 8 is a graph illustrating the relation between the current set value Iset of the oscillator in the first embodiment and the frequency of the output signal Fout. As illustrated in FIG. 8, in the digital control oscillator 13, as the operation current Is increases, the frequency changes from increase to decrease. In the digital control oscillator 13, since the tilt and magnitude of a change in the operation current Is changes according to variation in the transistor, according to the variation in the transistor, the tilt of the frequency change, the maximum frequency, and the magnitude of the current set value at which the frequency becomes maximum change.

More concretely, in the digital control oscillator 13, in the case where variation causing decrease in the threshold voltage Vth of the transistor occurs, the tilt of the frequency change of the output signal Fout becomes large. In the case where variation causing decrease in the threshold voltage Vth of the transistor occurs, the maximum frequency becomes low and the current set value corresponding to the maximum frequency decreases. On the other hand, in the digital control oscillator 13, in the case where variation causing increase in the threshold voltage Vth of the transistor occurs, the tilt of the frequency change of the output signal Fout becomes small. In the case where variation causing increase in the threshold voltage Vth of the transistor occurs, the maximum frequency becomes high and the current set value corresponding to the maximum frequency increases.

As described above, in the digital control oscillator 13, even in the case where the same current set value Iset is given, the frequency of the output signal Fout varies according to variation in the threshold voltage Vth of the transistor. In the digital control oscillator 13, in the case where the current set values Iset (for example, a first current set value P1 and a second current set value P2) at different two points are given, the difference occurs in the magnitude of the frequency difference between the output signals Fout at the two points due to the variation in the threshold voltage Vth of the transistor. In the example illustrated in FIG. 8, the frequency difference between the output signals Fout corresponding to the first and second current set values P1 and P2 becomes small, when the threshold voltage Vth of the transistor is high, and the frequency difference becomes large when the threshold voltage Vth of the transistor is low.

In the digital control oscillator 13, variation information of the transistor is obtained by using the frequency difference as described with reference to FIG. 8. More concretely, the control circuit 20 in the first embodiment obtains, as first frequency information, the frequency of the output signal Fout in a state where the operation current of the oscillation circuit 10 is set as the first current value and obtains, as second frequency information, the frequency of the output signal in a state where the operation current of the oscillation circuit 10 is set as the second current value. The control circuit 20 in the first embodiment corrects a current set value used for the oscillating operation of the oscillation circuit 10 on the basis of the frequency difference between first frequency obtained as the first frequency information and second frequency obtained as the second frequency information. The control circuit 20 obtains variation information corresponding to the frequency difference obtained with reference to the lock-up table of the process monitor 21.

Figure 9:
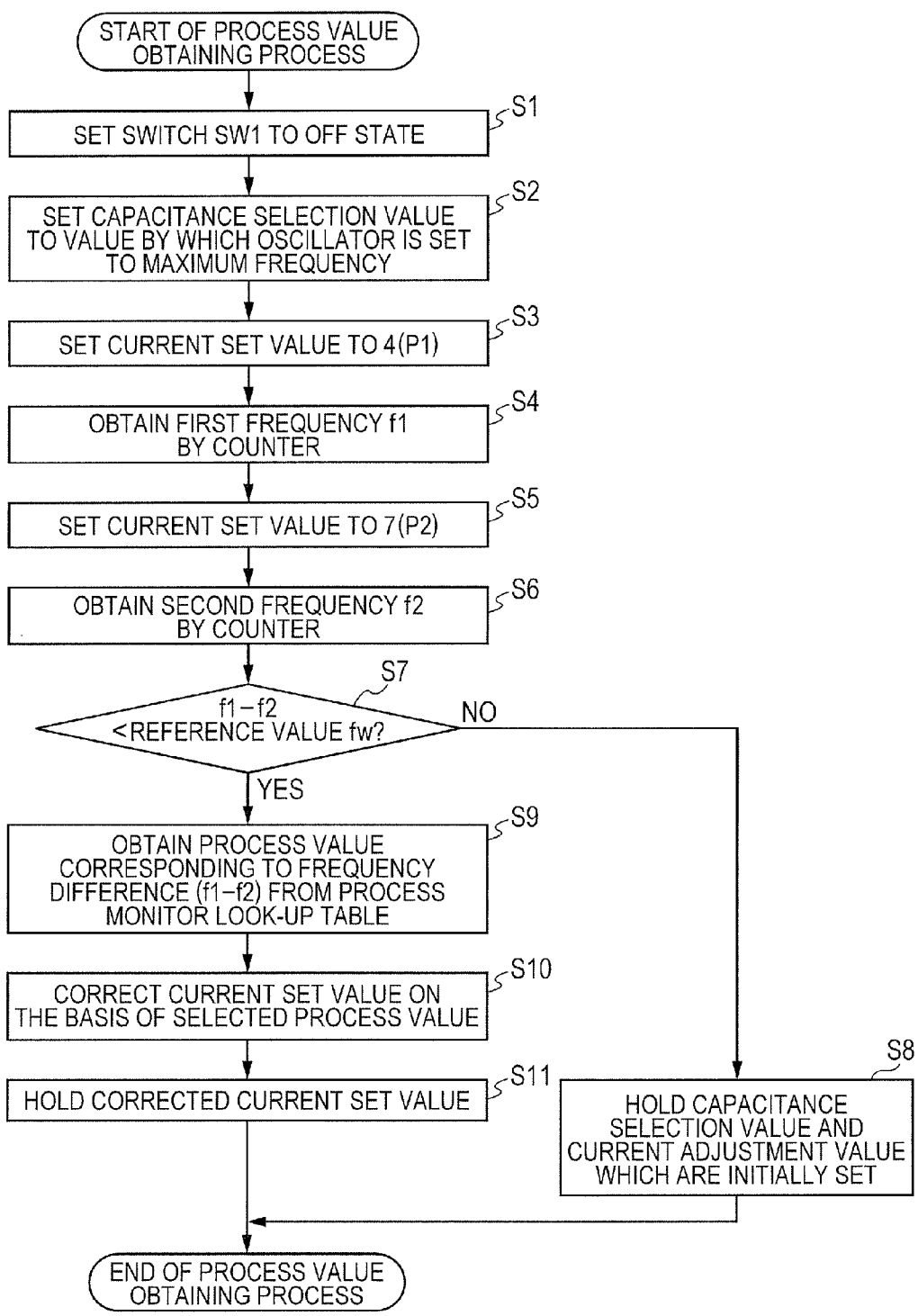
FIG. 9 is a flowchart illustrating the procedure of obtaining variation information and correcting the current set value in the semiconductor device in the first embodiment.

FIG. 9 is a flowchart illustrating the procedure of obtaining variation information and correcting the current set value in the semiconductor device 1 according to the first embodiment. In the semiconductor device 1 according to the first embodiment, operations illustrated in FIG. 9 are realized by operation using the control signal CNT from the outside, a variation information obtaining program (for example, firmware) which operates the control circuit 20, a sequencer provided in the control circuit 20, or the like.

As illustrated in FIG. 9, when process of obtaining variation information (for example, process value) starts, first, the control circuit 20 sets the switch SW1 to the off state (step S1). Accordingly, the oscillation circuit 10 interrupts transmission of the frequency control value FC to the digital control oscillator 13. In the digital control oscillator 13, when the transmission of the frequency control value FC is interrupted, all of the variable capacitance of the frequency adjusting unit 31 becomes invalid.

Subsequently, the control circuit 20 sets the capacitance selection value CS to a value by which the oscillation frequency of the digital control oscillator 13 becomes the maximum frequency (step S2). After that, the control circuit 20 sets the current set value Iset to the first current set value P1 (for example, four) (step S3). The control circuit 20 obtains the first frequency f1 as first frequency information by the counter 15 (step S4).

The control circuit 20 sets the current set value Iset to the second current set value P2 (for example, seven) (step S5). The control circuit 20 obtains the second frequency f2 as the second frequency information by the counter 15 (step S6).

The control circuit 20 compares the magnitude of the frequency difference (f1−f2) between the first and second frequencies f1 and f2 with a reference value fw (step S7). The reference value fw is a value which is set in advance. In the case where it is determined in step S7 that the frequency difference is larger than the reference value fw (NO in step S7), the control circuit 20 finishes the process while maintaining the current set value which is initially set without referring to the process monitor 21 (step S8). The reason is that when the frequency difference is larger than the reference value fw, there is the possibility that the frequency difference is not obtained correctly.

On the other hand, when it is determined in step S7 that the frequency difference is smaller than the reference value fw (YES in step S7), the control circuit 20 refers to the process monitor 21 and obtains the process value corresponding to the frequency difference as variation information (step S9).

After that, the control circuit 20 corrects the current set value Iset which is used for the oscillating operation of the oscillation circuit 10 on the basis of the obtained process value (step S10). For example, in the case where the process value expresses that the threshold voltage Vth of the transistor is high and varies, the current set value Iset is set to be smaller than the initially set value. In the case where the process value expresses that the threshold voltage Vth is low and varies, the current set value Iset is set to be larger than the initially set value. The control circuit 20 holds the corrected current set value Iset and finishes the process (step S11).

Figure 10:
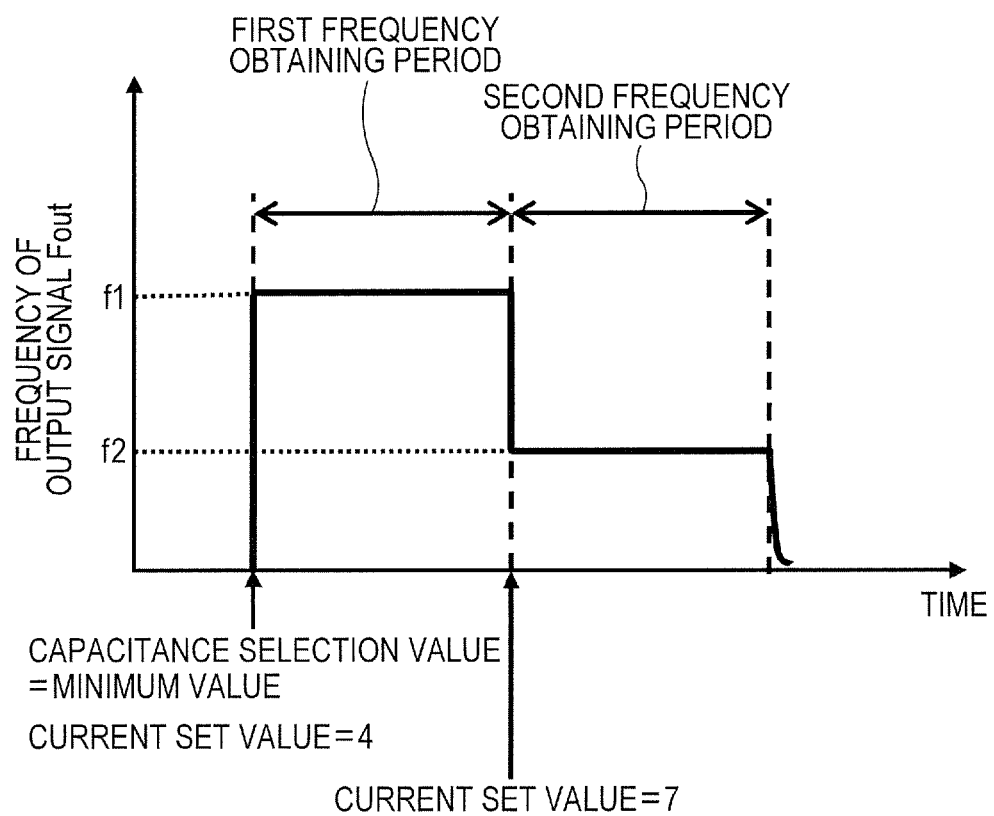
FIG. 10 is a timing chart illustrating the operation during operation of obtaining the variation information in the semiconductor device according to the first embodiment.

FIG. 10 is a timing chart illustrating the operation during operation of the semiconductor device 1 in the case of performing the operation according to the flowchart of FIG. 9. As illustrated in FIG. 10, in the case of obtaining variation information, first, the semiconductor device 1 sets the capacitance selection value CS to the minimum value, sets the current set value Iset to the first current set value (for example, four), and operates the digital control oscillator 13. At this time, the frequency of the output signal Fout which is output from the digital control oscillator 13 is the first frequency f1. The control circuit maintains the current set value for a preset period (for example, a first frequency obtaining period).

After completion of the first frequency obtaining period, while maintaining the capacitance selection value CS at the minimum value, the control circuit 20 switches the current set value Iset from the first current set value to the second current set value (for example, seven). Accordingly, the frequency of the output signal Fout which is output from the digital control oscillator 13 becomes the first frequency f1. The control circuit 20 maintains the current set value for a preset period (for example, a second frequency obtaining period).

In the semiconductor device 1 according to the first embodiment, the process value is obtained as variation information by the procedure as described above. There are variations in the timing of obtaining the variation information. The timings of obtaining the variation information and the temperature monitor value will be described later. In the following, the case of using the semiconductor device 1 as a circuit for generating local signals to a transmission circuit and a reception circuit will be described. It is assumed that the semiconductor device 1 repeats an operation state of performing oscillating operation and an idle state of performing no oscillating operation.

Figure 11:
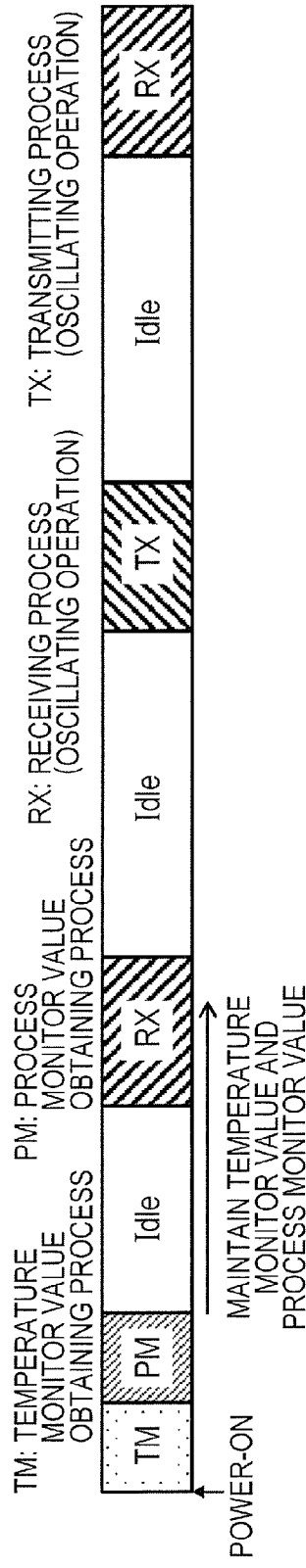
FIG. 11 illustrates a first example of a timing chart of timings of performing variation information obtaining operation in the semiconductor device according to the first embodiment.

FIG. 11 illustrates a first example of a timing chart showing timings of performing variation information obtaining operation in the semiconductor device according to the first embodiment. In the first example illustrated in FIG. 11, a temperature monitor value is obtained immediately after power on and, then, a process value is obtained. After that, using the temperature monitor value and the process value obtained, the oscillating operation of the oscillation circuit 10 is repeated intermittently.

Figure 12:
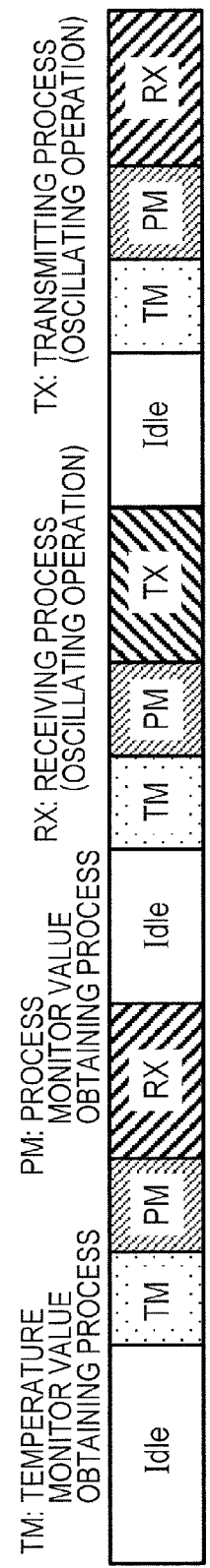
FIG. 12 illustrates a second example of a timing chart of timings of performing variation information obtaining operation in the semiconductor device according to the first embodiment.

FIG. 12 illustrates a second example of a timing chart showing timings of performing variation information obtaining operation in the semiconductor device according to the first embodiment. In the second example illustrated in FIG. 12, a temperature monitor value and a process value are obtained immediately before the oscillation circuit 10 performs the oscillating process, and the oscillating process is performed using the temperature monitor value and the process value obtained. In the second example illustrated in FIG. 12, the temperature monitor value and the process value are obtained each time the oscillation circuit 10 performs the oscillating operation.

Figure 13:
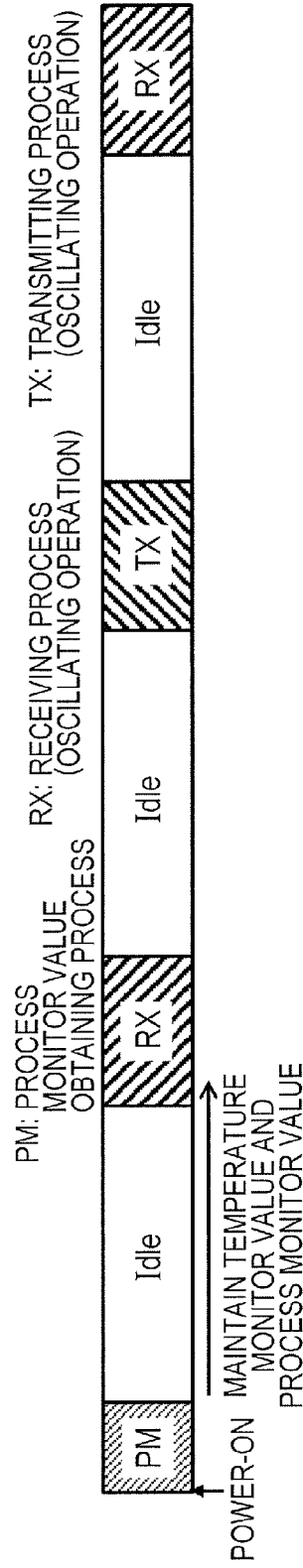
FIG. 13 illustrates a third example of a timing chart of timings of performing variation information obtaining operation in the semiconductor device according to the first embodiment.
Figure 14:
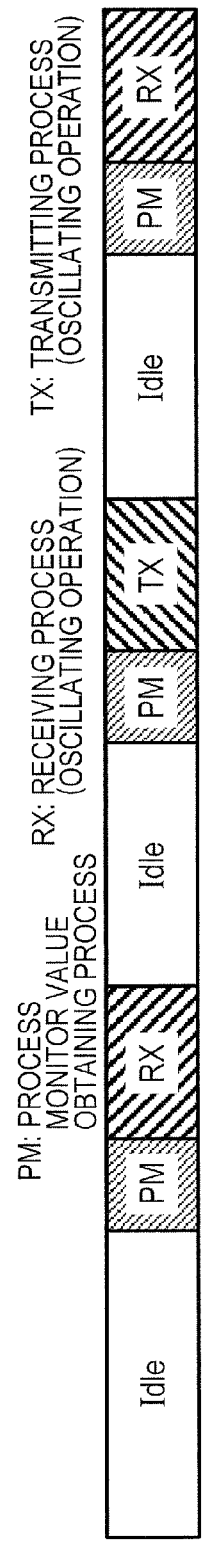
FIG. 14 illustrates a fourth example of a timing chart of timings of performing variation information obtaining operation in the semiconductor device according to the first embodiment.

FIG. 13 illustrates a third example of a timing chart showing timings of performing variation information obtaining operation in the semiconductor device according to the first embodiment. In the third example illustrated in FIG. 13, the temperature monitor value obtaining process in the first example illustrated in FIG. 11 is omitted. FIG. 14 illustrates a fourth example of a timing chart showing timings of performing variation information obtaining operation in the semiconductor device according to the first embodiment. In the fourth example illustrated in FIG. 14, the temperature monitor value obtaining process in the second example illustrated in FIG. 12 is omitted. As described above, the temperature monitor value has to be always obtained to obtain the process value.

In the above description, in the semiconductor device 1 according to the first embodiment, the control circuit 20 makes the digital control oscillator 13 operate with two different operation currents to obtain the frequency difference of the output signals Fout of the digital control oscillator 13 in the case of changing the operation currents. The control circuit 20 obtains the process value corresponding to the obtained frequency difference from the table information of the process monitor 21. With the configuration, without separately providing a monitor circuit or the like, the semiconductor device 1 according to the first embodiment obtains information on manufacture variation and performs various correcting processes on the basis of the obtained variation information.

Another method of obtaining manufacture variation information of the semiconductor device will now be examined. In the case of obtaining manufacture variation information of the semiconductor device, for example, an oscillation circuit, such as a ring oscillator is formed on a semiconductor substrate, and the magnitude of manufacture variation of a circuit element such as a transistor is determined from the oscillation frequency of the ring oscillator. In this case, however, the ring oscillator becomes a noise source and a problem that the noise characteristic of the oscillation circuit 10 which is desired to be used as a function circuit deteriorates occurs. In the case of supplying a correction signal in which manufacture variation is reflected to an oscillator such as a voltage oscillator like in the patent literature 1, the correction signal becomes a noise source for the output signal, and a problem that the noise source worsens the noise characteristic of the oscillation circuit 10 occurs. In the case of separately providing a ring oscillator and a correction circuit, a problem that the circuit area increases occurs.

On the other hand, in the semiconductor device 1 according to the first embodiment, on the basis of the frequency of the output signal Fout of the oscillation circuit 10 used for actual operation, a variation amount of a circuit element as a component of the circuit can be grasped. Consequently, in the semiconductor device 1 according to the first embodiment, a problem that the circuit area increases does not occur.

In the semiconductor device 1 according to the first embodiment, a control signal used at the time of obtaining a process value and a control signal used to actually operate the oscillation circuit 10 are the same. More concretely, in the semiconductor device 1 according to the first embodiment, at the time of obtaining the process value, it is sufficient to set the value of a control signal (for example, the capacitance selection value CS and the current set value Iset) used at the time of operating the oscillation circuit 10 to a predetermined value. Consequently, also in the case of correcting the operation condition of the oscillation circuit 10 on the basis of the process value, the number of signals supplied to the oscillation circuit 10 does not change, and the noise characteristic of the output signal Fout can be maintained preferably.

In the semiconductor device 1 according to the first embodiment, the process value is grasped on the basis of the frequency difference obtained in the control circuit 20. The component added in this case is only the process monitor 21 including the table information. The table information is simple one indicating the correspondence between the frequency difference and the process value. Consequently, in the semiconductor device 1 according to the first embodiment, for example, the process monitor 21 can be realized by using a part of a storage such as a built-in memory storing firmware or the like without accompanying increase in the circuit area.

In the case where manufacture processes and product series are different, there is the case that the relation between a variation amount in a circuit element and the frequency difference of the output signal Fout varies. However, the relation between the frequency difference of the output signal Fout and the variation amount of the circuit element can be grasped in the design stage or at the time of evaluating a product. Consequently, by rewriting table information product by product, optimization of the output signal Fout for each product can be performed. Only by such rewriting of table information, the invention can be applied to optimize various kinds. Therefore, in products employing the method of obtaining variation information of the semiconductor device 1 according to the first embodiment, the development period can be shortened.

In the semiconductor device 1 according to the first embodiment, the circuits connected to an output of the oscillation circuit 10 at the time of the process value and those at the time of actual operation are the same. Consequently, correction can be reflected in actual operation with high precision on the basis of the obtained process value.

In the semiconductor device 1 according to the first embodiment, by correcting the current set value Iset used for actual oscillating operation on the basis of the obtained process value, the output characteristic of the oscillation circuit 10 can be maintained excellently.

Further, in the semiconductor device 1 according to the first embodiment, even variation occurs in the circuit element, by correcting the value of the control signal in accordance with the variation amount, the circuit characteristic can be maintained excellently. Consequently, variation allowance which is considered at the time of designing in which variations in circuit elements are considered can be minimized, and reduction in the circuit area and reduction in consumption current can be realized.

Second Embodiment

In a second embodiment, an example of using the capacitance selection value CS as frequency information obtained in the control circuit will be described. A semiconductor device 2 according to the second embodiment has an auto band selection (ABS) function of automatically selecting the capacitance value of the digital control oscillator 13 so that the frequency of the output signal Fout of the oscillation circuit becomes set frequency. In the second embodiment, frequency information is obtained by using the ABS function. In the description of the second embodiment, to the components described in the first embodiment, the same reference numerals as those in the first embodiment are designated, and the description will not be repeated.

Figure 15:
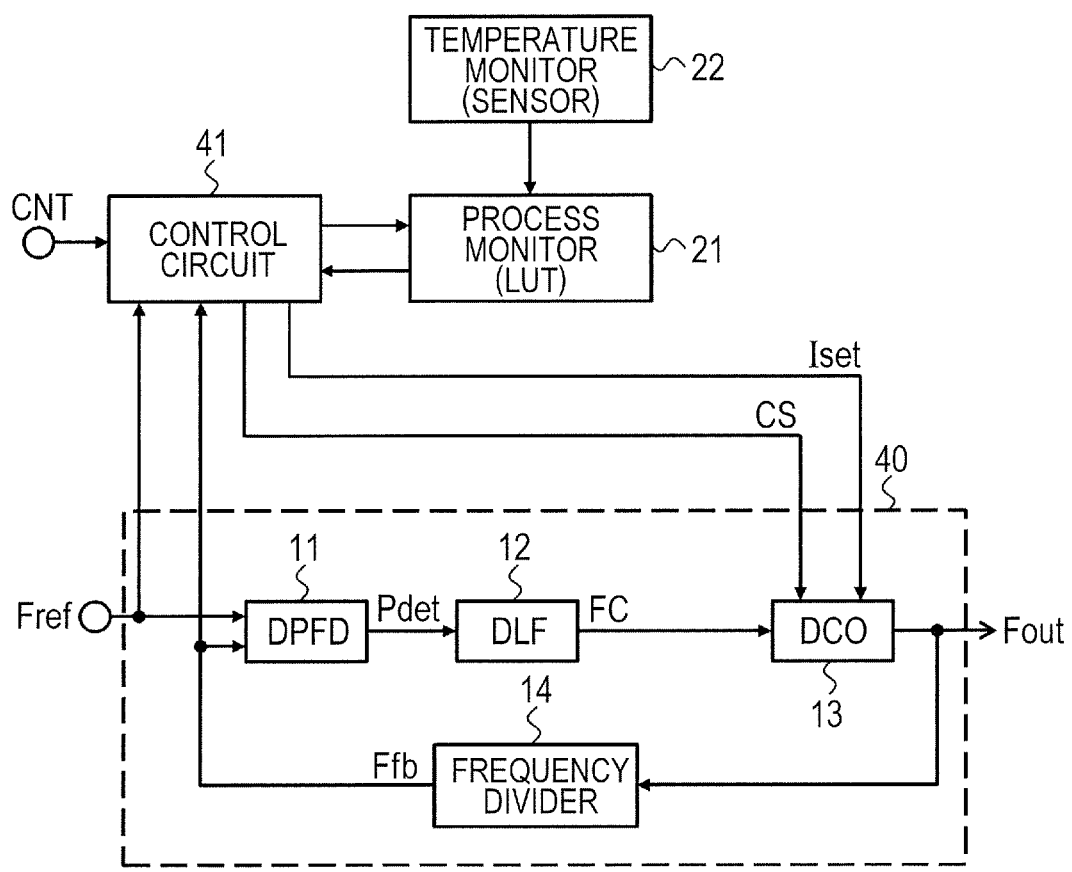
FIG. 15 is a block diagram of a semiconductor device according to a second embodiment.

FIG. 15 is a block diagram of the semiconductor device 2 according to the second embodiment. As illustrated in FIG. 15, the semiconductor device 2 according to the second embodiment has a control circuit 41 in place of the control circuit 20 in the first embodiment and has an oscillation circuit 40 in place of the oscillation circuit 10.

The oscillation circuit 40 is obtained by eliminating the switch circuit SW1 and the counter 51 in the oscillation circuit 10 and directly connecting the filter circuit 12 and the digital control oscillator 13. The oscillation circuit 40 outputs a reference signal Fref and a feedback signal Ffb to the control circuit 41.

The digital control oscillator 13 of the oscillation circuit 40 has a variable capacitor (for example, the frequency band setting unit 30 and the frequency adjusting unit 31) like in the first embodiment, and the frequency of an output signal is set according to the capacitance value of the variable capacitor.

The control circuit 41 is obtained by providing the control circuit 20 with the ABS function and a frequency information obtaining function using the ABS function. More concretely, the control circuit 41 adjusts the capacitance selection value CS so that the digital control oscillator 13 can perform oscillating operation in a frequency band which is determined in advance by using the ABS function. At this time, the control circuit 41 detects a lock state of the oscillation circuit 40 on the basis of the phase difference between the reference signal Fref and the feedback signal Ffb and obtains, as frequency information, the capacitance selection value CS when the oscillation circuit 40 enters the lock state.

In the case of obtaining frequency information, the control circuit 41 obtains first frequency information related to frequency of the output signal Fref in a state where the operation current of the digital control oscillator 13 is set as a first current value and second frequency information related to frequency of the output signal in a state where the operation current is set as a second current value. The control circuit 41 outputs the capacitance selection value CS designating the capacitance value of the variable capacitance. The control circuit 41 sets a target value of the frequency of the output signal Fout, makes the oscillation circuit 41 start generating the output signal Fout in a state where the operation current is set to the first current value, adjusts the capacitance selection value CS so that the frequency of the output signal Fout becomes a target value, and obtains, as first frequency information, the capacitance selection value CS in a state where the frequency of the output signal becomes the target value. The control circuit 41 makes the oscillation circuit 41 start generating the output signal Fout in a state where the operation current is set to the second current value, adjusts the capacitance selection value CS so that the frequency of the output signal Fout becomes a target value, and obtains, as second frequency information, the capacitance selection value CS in a state where the frequency of the output signal becomes the target value. After that, the control circuit 41 obtains variation information (for example, a process value) of a transistor on the basis of a difference value between a first capacitance selection value b1 obtained as the first frequency information and a second capacitance selection value b2 obtained as the second frequency information. The control circuit 41 corrects the current set value Iset used for the oscillating operation of the oscillation circuit on the basis of the obtained variation information.

Figure 16:
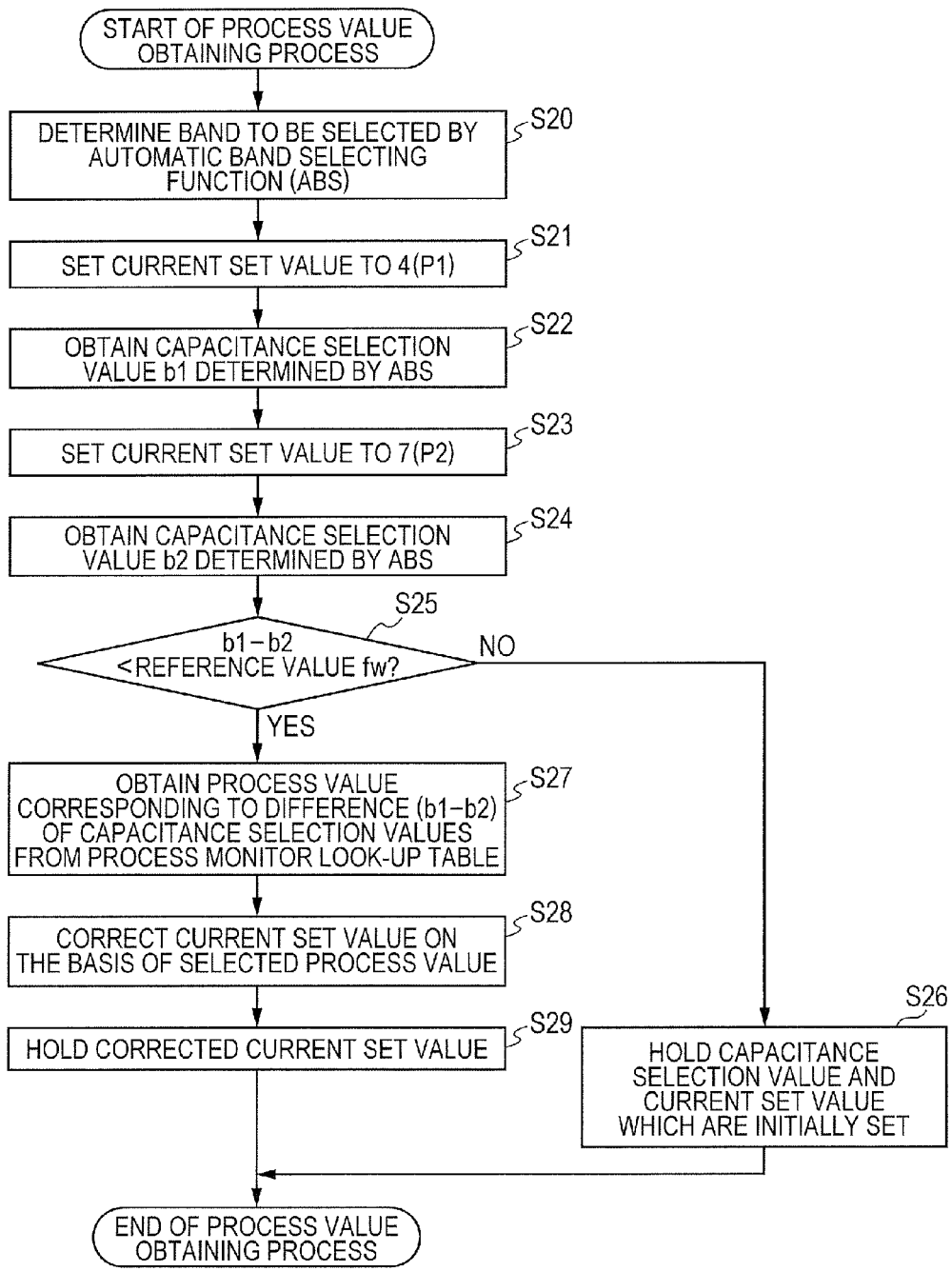
FIG. 16 is a flowchart illustrating the procedure of obtaining variation information and correcting a current set value in the semiconductor device according to the second embodiment.

Subsequently, the operation of the semiconductor device 2 according to the second embodiment will be described. FIG. 16 is a flowchart illustrating the procedure of obtaining variation information and correcting a current set value in the semiconductor device 2 according to the second embodiment. In the semiconductor device 2 according to the second embodiment, operations illustrated in FIG. 16 are realized by operation using the control signal CNT from the outside, a variation information obtaining program (for example, firmware) which operates the control circuit 41, a sequencer provided in the control circuit 41, or the like.

As illustrated in FIG. 16, when process of obtaining variation information (for example, process value) starts, first, the control circuit 41 determines a target value (a band selected by the ABS function) of the frequency of the output signal Fout of the oscillation circuit 40 (step S20).

Subsequently, the control circuit 41 sets the current set value Iset to the first current set value P1 (for example, four) (step S21). Accordingly, the control circuit 40 becomes operative with operation current of the first current value. The control circuit 41 obtains, as first frequency information, the capacitance selection value CS (for example, the first capacitance selection value b1) in a state where the frequency of the output signal Fout reaches a target value by using the ABS function (step S22).

The control circuit 41 sets the current set value Iset to the second current set value P2 (for example, seven) (step S23). Accordingly, the oscillation circuit 40 becomes operative with operation current of a second current value. The control circuit 41 obtains, as first frequency information, the capacitance selection value CS (for example, the second capacitance selection value b2) in a state where the frequency of the output signal Fout reaches a target value by using the ABS function (Step S24).

The control circuit 41 compares the magnitude of the difference (b1–b2) between the first and second capacitance selection values b1 and b2 with a reference value fw (step S25). The reference value fw is a value which is set in advance. In the case where it is determined in step S25 that the difference between the first and second capacitance selection values b1 and b2 is larger than the reference value fw (NO in step S25), the control circuit 41 finishes the process while maintaining the current set value which is initially set without referring to the process monitor 21 (step S26). The reason is that when the difference between the first and second capacitance selection values b1 and b2 is larger than the reference value fw, there is the possibility that the difference is not obtained correctly.

On the other hand, when it is determined in step S25 that the difference between the first and second capacitance selection values b1 and b2 is smaller than the reference value fw (YES in step S25), the control circuit 41 refers to the process monitor 21 and obtains the process value corresponding to the difference between the first and second capacitance selection values b1 and b2 as variation information (Step S27).

After that, the control circuit 41 corrects the current set value Iset which is used for the oscillating operation of the oscillation circuit 40 on the basis of the Obtained process value (step S28). For example, in the case where the process value expresses that the threshold voltage Vth of the transistor is high and varies, the current set value Iset is set to be smaller than the initially set value. In the case where the process value expresses that the threshold voltage Vth is low and varies, the current set value Iset is set to be larger than the initially set value. The control circuit 41 holds the corrected current set value Iset and finishes the process (step S29).

Figure 17:
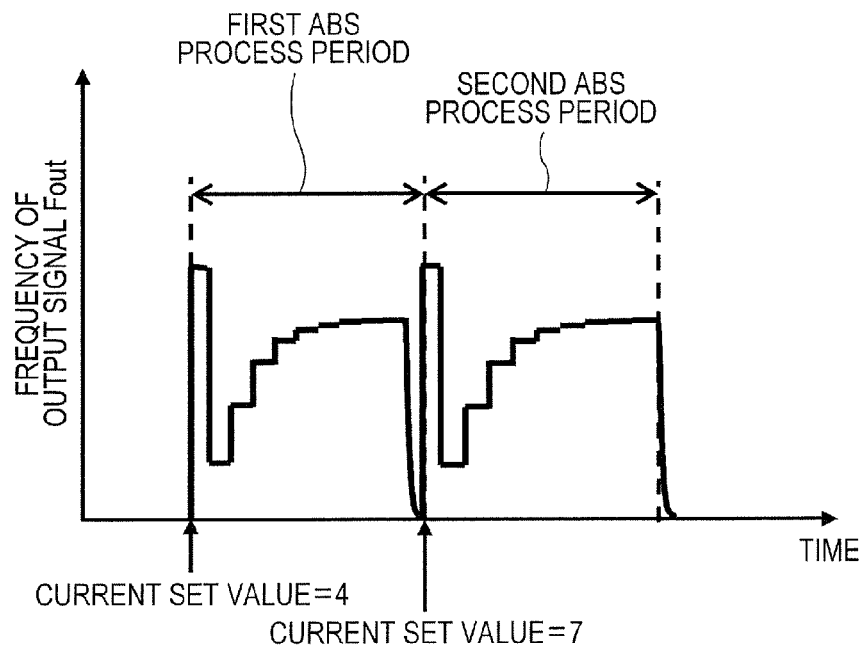
FIG. 17 is a timing chart illustrating the operation during the variation information obtaining operation in the semiconductor device according to the second embodiment.

FIG. 17 is a timing chart illustrating the operation during operation of the semiconductor device 2 in the case of performing the operation according to the flowchart of FIG. 16. As illustrated in FIG. 17, in the case of obtaining variation information, first, the semiconductor device 2 sets the current set value Iset to the first current set value (for example, four), and operates the oscillation circuit 40. At this time, the frequency of the output signal Fout which is output from the oscillation circuit 40 is the frequency (target value) of the selected hand and, in this state, the capacitance selection value CS (first capacitance selection value b1) is determined. The control circuit 41 maintains the current set value for a preset period (for example, a first ABS process period).

After completion of the first ABS process period, while maintaining the selected band, the control circuit 40 switches the current set value Iset from the first current set value to the second current set value (for example, seven). The control circuit 41 adjusts the value of the capacitance selection value CS so that the frequency of the output signal Fout which is output from the oscillation circuit 40 becomes the target value again by the ABS function. Accordingly, the capacitance selection value CS (second capacitance selection value b2) corresponding to the second operation current value is determined in the second ABS process period.

In the above description, in the semiconductor device 2 according to the second embodiment, two capacitance selection values determined by using the ABS function are used as frequency information. As described above, information other than the frequency of the output signal Fout can be used as the frequency information. That is, frequency information used to refer to variation information may be information in which the difference occurs according to a change in the operation current of the digital control oscillator 13, and various information can be used.

Since it is unnecessary to use the counter 15 in the semiconductor device 2 of the second embodiment, the circuit scale can be reduced.

The ABS function is a function used for the actual operation of the semiconductor device 2 and is not a function separately provided to obtain variation information. Consequently, even when the variation information obtaining method of the second embodiment is used, there are no disadvantages on the design period and the circuit area.

Third Embodiment

In a third embodiment, an example of using the current set value Iset as variation information will be described. The characteristic of the output signal Fout of the digital control oscillator 13 is that, as illustrated in FIGS. 4 to 6, in a state where the frequency is the maximum frequency, the amplitude saturates and the phase noise becomes the smallest. Consequently, in the third embodiment, the current set value Iset for the operation current Is at which the frequency of the output signal Fout becomes the maximum is measured, and variation information of the transistor is obtained from the difference of the magnitude of the current set value Iset derived by the measurement and a reference current set value as a reference which is preliminarily determined.

Figure 18:
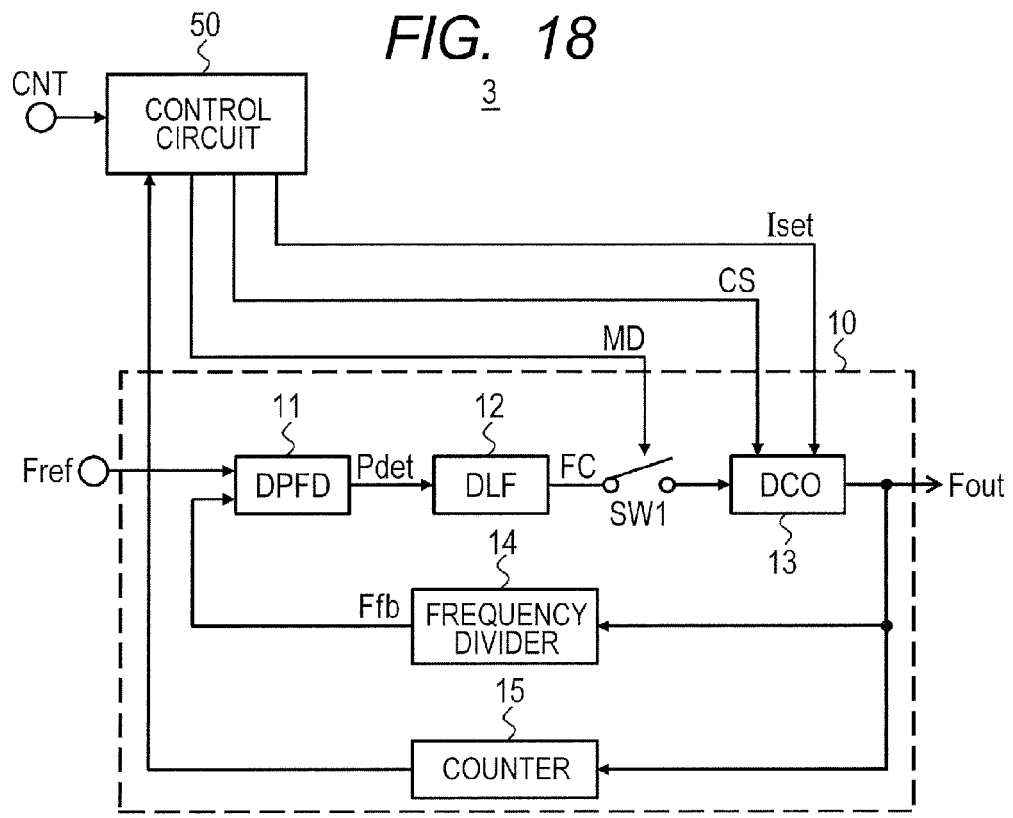
FIG. 18 is a block diagram of a semiconductor device according to a third embodiment.

FIG. 18 is a block diagram of a semiconductor device 3 according to a third embodiment. As illustrated in FIG. 18, the semiconductor device 3 is obtained by replacing the control circuit 20 of the semiconductor device 1 according to the first embodiment with a control circuit 50 and deleting the process monitor 21 and the temperature monitor 22. In the description of the third embodiment, the same reference numerals as those of the first embodiment are designated to the same components described in the first embodiment, and the description will not be repeated.

The control circuit 50 increases the current set value every process cycle, obtains the frequency of an output signal obtained in a preceding cycle as first frequency information, and obtains the frequency of an output signal obtained in a present cycle as second frequency information. In the case where the second frequency obtained as the second frequency information decreases relative to the first frequency obtained as the first frequency information, the control circuit 50 uses the current set value used in the preceding cycle for the oscillating operation of the oscillation circuit. The control circuit 50 obtains the current set value Iset used for the oscillating operation as variation information. In the embodiment, the control circuit 50 sets the current set value to the minimum value of the operation current and performs the first cycle in process cycles. The control circuit 50 set the oscillation frequency of the digital control oscillator 13 to the maximum value by the capacitance selection value CS in the period of obtaining the frequency information.

Figure 19:
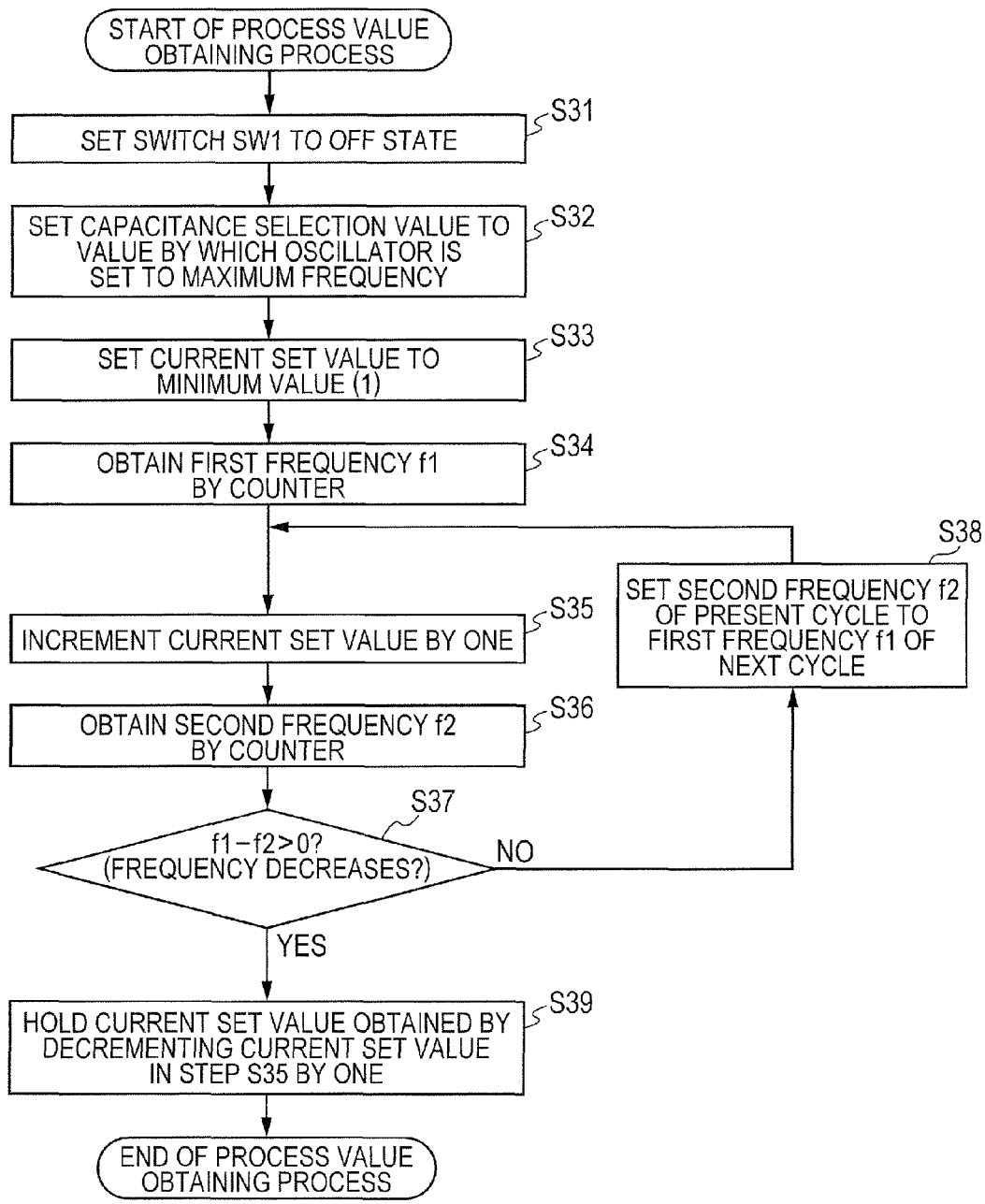
FIG. 19 is a flowchart illustrating the procedure of obtaining variation information and correcting a current set value in the semiconductor device according to the third embodiment.

Subsequently, the operation of the semiconductor device 3 according to the third embodiment will be described. FIG. 19 is a flowchart illustrating the procedure of obtaining variation information and correcting a current set value in the semiconductor device 3 according to the third embodiment. In the semiconductor device 3 according to the third embodiment, operations illustrated in FIG. 19 are realized by operation using the control signal CNT from the outside, a variation information obtaining program (for example, firmware) which operates the control circuit 50, a sequencer provided in the control circuit 50, or the like.

As illustrated in FIG. 19, when process of obtaining variation information (for example, process value) starts, first, the control circuit 50 sets the switch SW1 to the off state (step S31). Accordingly, the oscillation circuit 50 interrupts transmission of the frequency control value FC to the digital control oscillator 13. In the digital control oscillator 13, when the transmission of the frequency control value FC is interrupted, all of the variable capacitance of the frequency adjusting unit 31 becomes invalid.

Subsequently, the control circuit 50 sets the capacitance selection value CS to a value by which the oscillation frequency of the digital control oscillator 13 becomes the maximum frequency (step S32). After that, the control circuit 50 sets the current set value Iset to the minimum value (for example, one) (step S33). The control circuit 50 obtains the first frequency f1 as first frequency information by the counter 15 (step S34).

The control circuit 50 sets the current set value Iset to a value obtained by incrementing the current set value Iset by one (step S35). The control circuit 50 obtains the second frequency f2 as the second frequency information by the counter 15 (step S36).

The control circuit 50 determines whether the frequency of the output signal Fout decreases or not on the basis of the frequency difference (f1−f2) between the first and second frequencies f1 and f2 (step S37). In the case where it is determined in step S37 that the frequency of the output signal Fout increases (NO in step S37), the control circuit 50 sets the second frequency f2 of the present cycle to the first frequency f1 of the next cycle (step S38). The control circuit 50 sets again the current set value to a value obtained by incrementing the current set value by one (step S35). The frequency of the output signal Fout of the present cycle is obtained as the second frequency f2 (step S36). The process cycle from the step S35 to the step S38 is repeated until it is determined that the frequency of the output signal Fout decreases (step S37).

When it is determined in step S37 that the frequency of the output signal Fout decreases (YES in step S37), the control circuit 50 holds an operation current value obtained by decreasing the operation current value set in step S35 by one as a final operation current value (step S39), and finishes the process.

After that, the control circuit 50 can obtain variation information on the basis of the difference between the obtained current set value and the reference current set value which is set in advance. In the third embodiment, the current set value Iset obtained by the procedure of the flowchart illustrated in FIG. 19 is used as it is as the operation current value after the correction.

Figure 20:
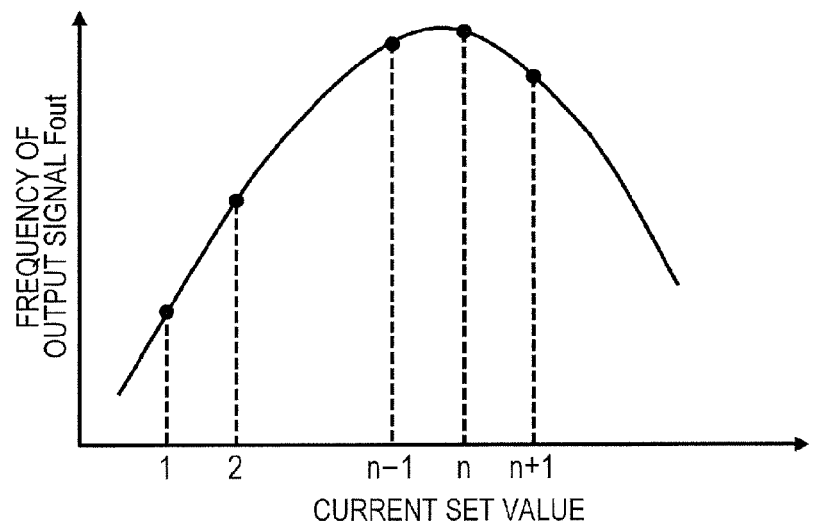
FIG. 20 is a graph illustrating changes in the current set value and the frequency of the output signal in the variation information obtaining operation in the semiconductor device according to the third embodiment.

FIG. 20 is a graph illustrating changes in the current set value and the frequency of the output signal in the variation information obtaining operation in the semiconductor device according to the third embodiment. As illustrated in FIG. 20, according to increase in the operation current value, the frequency of the output signal Fout rises. At the time point when the operation current value changes from "n" to "n+1", the frequency of the output signal Fout decreases. That is, in response to the decrease in the frequency of the output signal Fout which occurs by the change in the operation current value from "n" to "n+1", the frequency information obtaining process is finished.

Figure 21:
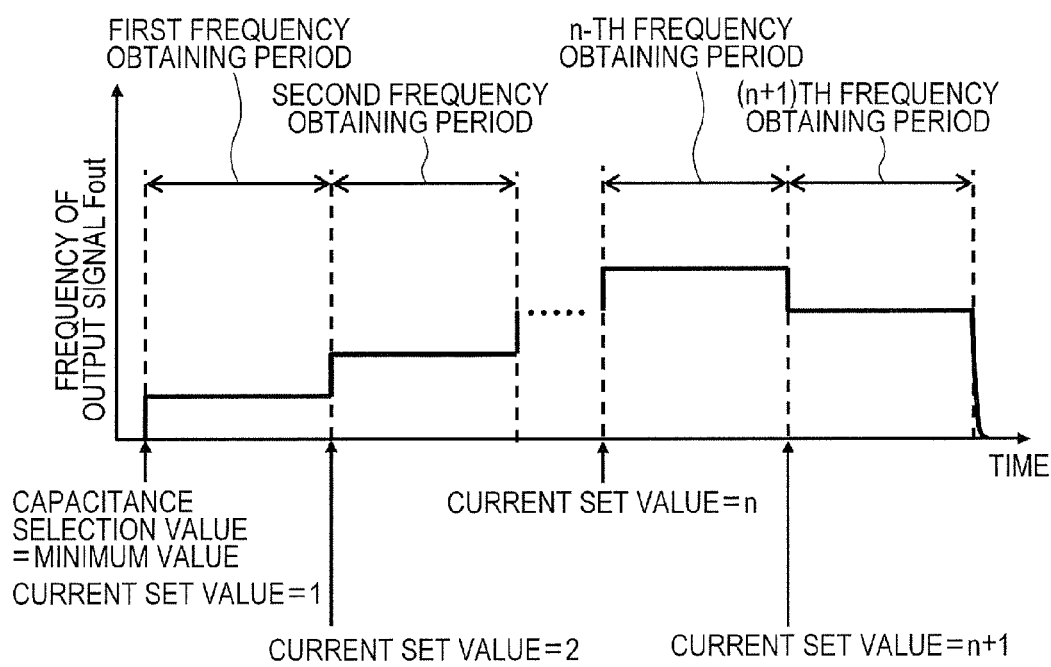
FIG. 21 is a timing chart illustrating the operation in the variation information obtaining operation in the semiconductor device according to the third embodiment.

FIG. 21 is a timing chart illustrating the operation of the semiconductor device 3 in the case of performing the operation according to the flowchart shown in FIG. 19. As illustrated in FIG. 21, in the case of obtaining variation information, first, the semiconductor device 3 sets the capacitance selection value CS to the minimum value, sets the current set value Iset to the minimum value, and operates the digital control oscillator 13. At this time, the frequency of the output signal Fout which is output from the digital control oscillator 13 is the first frequency f1. The control circuit 50 obtains the frequency of the output signal Fout while maintaining the current set value for a predetermined period.

After completion of the first frequency obtaining period, the control circuit 50 increases the current set value Iset by one while maintaining the capacitance selection value CS at the minimum value. As a result, the frequency of the output signal Fout which is output from the digital control oscillator 13 becomes the second frequency f2. The control circuit 50 increases the current set value Iset until the frequency of the output signal Fout decreases and sets, as the final current set value, the current set value which is smaller than the current set value at which the frequency of the output signal Fout changes to decrease by one.

In the above description, in the semiconductor device 3 of the third embodiment, by gradually changing the current set value until the frequency of the output signal Fout changes from increase to decrease, the current set value at which the amplitude and phase noise of the output signal Fout have the most preferable characteristic is determined. In the third embodiment, variation information of the transistor can be obtained on the basis of the magnitude of the difference between the determined current set value and a reference current set value which is preset.

In the semiconductor device 3 of the third embodiment, without using the process monitor 21, the optimum current set value can be determined. Since it is unnecessary to use the process monitor 21 in the semiconductor device 3 of the third embodiment as described above, the circuit area can be reduced.

In the semiconductor device 3 of the third embodiment, the current set value at which the oscillation circuit 10 can operate optimally at the time point of obtaining frequency information can be determined. That is, in the semiconductor device 3 of the third embodiment, without using the temperature monitor, the optimum current set value in which temperature information is added can be determined. The semiconductor device 3 of the third embodiment can increase traceability to temperature as the operation characteristic of the semiconductor device 3.

Fourth Embodiment

Figure 22:
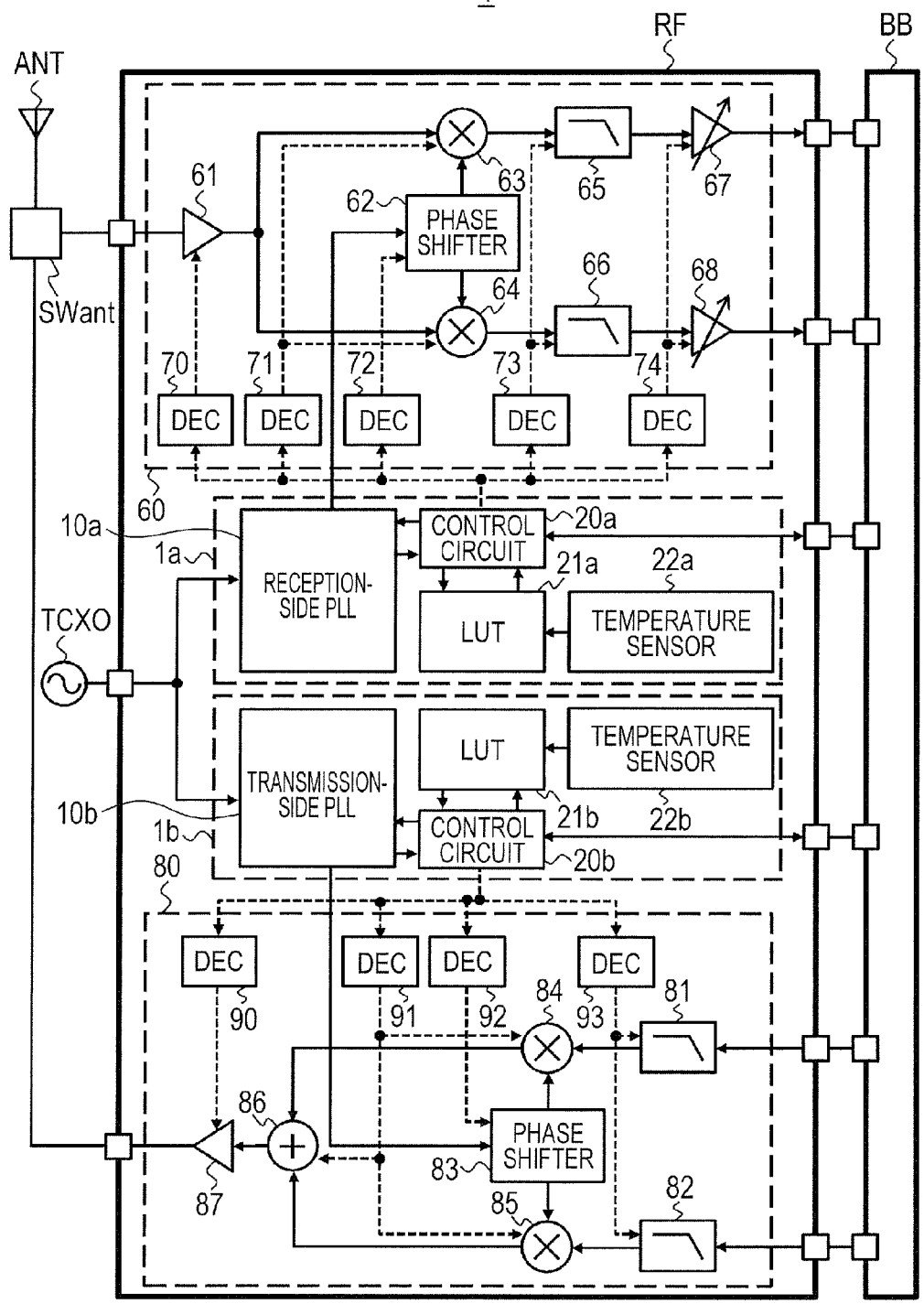
FIG. 22 is a block diagram of a semiconductor device according to a fourth embodiment.

In a fourth embodiment, an example of correcting characteristics of another circuit by using variation information obtained in the semiconductor device 1 according to the first embodiment will be described. FIG. 22 is a block diagram of a semiconductor device 4 according to the fourth embodiment. The semiconductor device 4 illustrated in FIG. 22 has a radio circuit RF and a baseband circuit BB. In FIG. 4, an antenna ANT, an antenna switch Swant, and an external oscillator TCXO provided for the semiconductor device 4 are also illustrated.

The radio circuit RF performs a demodulating process of demodulating a radio signal obtained via the antenna to a baseband signal and a modulating process of modulating transmission data which is output from the baseband circuit BB to a radio signal. The baseband circuit BB performs a decoding process on a baseband signal and a coding process on transmission data. The baseband circuit BB outputs a control signal CNT to the radio circuit RF.

The radio circuit RF has a reception-side local signal generation circuit 1a, a transmission-side local signal generation circuit 1b, a reception circuit 60, and a transmission circuit 80. The reception-side local signal generation circuit 1a and the transmission-side local signal generation circuit 1b include circuit blocks of the semiconductor device 1 according to the first embodiment. In FIG. 22, as reference numerals of the circuit blocks included in the reception-side local signal generation circuit 1a, reference numerals obtained by adding "a" to each of the same reference numerals of the circuit blocks of the semiconductor device 1 according to the first embodiment are used. As reference numerals of the circuit blocks included in the transmission-side local signal generation circuit 1b, reference numerals obtained by adding "b" to each of the same reference numerals of the circuit blocks in the semiconductor device 1 according to the first embodiment are used. In the semiconductor device 4, oscillation circuits 10a and 10b use a signal which is output from the external oscillator TCXO as the reference signal Fref.

The reception-side local signal generation circuit 1a obtains variation information by the operation of the semiconductor device 1 according to the first embodiment. The variation information is obtained by a control circuit 20a. The control circuit 20a supplies the obtained variation information to the reception circuit 60. The oscillation circuit 10a of the reception-side local signal generation circuit 1a supplies the output signal Fout as a local signal to the reception circuit 60.

The transmission-side local signal generation circuit 1b obtains variation information by the operation of the semiconductor device 1 according to the first embodiment. The variation information is obtained by the control circuit 20b. The control circuit 20b supplies the obtained variation information to the transmission circuit 80. The oscillation circuit 10b of the transmission-side local signal generation circuit 1b supplies the output signal Fout as a local signal to the transmission circuit 80.

The reception circuit 60 has a low-noise amplifier 61, a phase shifter 62, mixers 63 and 64, filter circuits 65 and 66, variable gain amplifiers 67 and 68, and decoders 70 to 74.

The low-noise amplifier 61 amplifies the radio signal obtained via the antenna ANT and transmits the amplified signal to a post-stage circuit. The decoder 70 decodes variation information supplied from the control circuit 20a of the reception-side local signal generation circuit 1a to generate a correction signal to the low-noise amplifier 61.

The phase shifter 62 shifts the phase of a local signal which is output from the oscillation circuit 10a of the reception-side local signal generation circuit 1a and supplies the resultant signal to the mixers 63 and 64. The phase shifter 62 generates an I signal and a Q signal from the output signal Fout. The decoder 72 decodes variation information supplied from the control circuit 20a of the reception-side local signal generation circuit 1a to generate a correction signal to the phase shifter 62.

The mixers 63 and 64 demodulate the radio signal which is output from the low-noise amplifier 61 by using the I signal and the Q signal. The decoder 71 decodes the variation on information supplied from the control circuit 20a of the reception-side local signal generation circuit 1a to generate a correction signal to the mixers 63 and 64.

The filter circuits 65 and 66 eliminate a noise component included in the signals demodulated by the mixers 63 and 64. The decoder 73 decodes the variation information supplied from the control circuit 20a of the reception-side local signal generation circuit 1a to generate the correction signal for the filter circuits 65 and 66.

The variable gain amplifiers 67 and 68 amplify the amplitude of signals output from the filter circuits 65 and 66 to predetermined amplitude and output the resultant signals to the baseband circuit BB. The decoder 74 decodes the variation information supplied from the control circuit 20a of the reception-side local signal generation circuit 1a to generate a correction signal to the variable gain amplifiers 67 and 68.

The transmission circuit 80 has filter circuits 81 and 82, a phase shifter 83, mixers 84 and 85, an adder 86, a power amplifier 37, and decoders 90 to 93.

The filter circuit 61 eliminates a noise component in transmission data supplied from the baseband circuit BB. The decoder 93 decodes the variation information supplied from the control circuit 20b of the reception-side local, signal generation circuit 1b to generate a correction signal to the filter circuits 81 and 82.

The phase shifter 83 shifts the phase of the local signal which is output from the oscillation circuit 10b of the transmission-side local signal generation circuit 1b and supplies the resultant signal to the mixers 84 and 85. The phase shifter 83 generates an I signal and a Q signal from the output signal Fout. The decoder 92 decodes the variation information supplied from the control circuit 20b of the transmission-side local signal generation circuit 1b to generate a correction signal to the phase shifter 83.

The mixers 84 and 85 modulate transmission data obtained via the filter circuits 81 and 82 by using the I signal and the Q signal. The adder 86 adds the transmission signals which are output from the mixers 84 and 85 and outputs the resultant signal to the power amplifier 87. The decoder 91 decodes the variation information supplied from the control circuit 20b of the transmission-side local signal generation circuit 1b to generate a correction signal to the mixers 84 and 85 and the adder 86.

The power amplifier 87 amplifies a signal output from the adder 86 and drives the antenna ANT. The decoder 90 decodes the variation information supplied from the control circuit 20b of the transmission-side local signal generation circuit 1b to generate the correction signal for the power amplifier 87.

The semiconductor device 4 according to the fourth embodiment has a plurality of circuits of different functions. The plurality of circuits have different circuit characteristics which fluctuate according to the variation in the circuit elements. Consequently, in the semiconductor device 4, correction circuits (for example, a plurality of decoders) are provided in accordance with the kinds of circuits, and a correction signal is individually generated to a corresponding circuit from single variation information by using the plurality of decoders. In such a manner, in the semiconductor device 4, the characteristics of a plurality of circuits having different correction elements can be corrected by the variation information obtained by the reception-side local signal generation circuit 1a and the transmission-side local signal generation circuit 1b.

By obtaining variation information by using the method of obtaining variation information in the semiconductor device according to any of the first to third embodiments as described above, the correcting process on the other circuit blocks in the semiconductor device can be performed. On the other hand, in the case of employing the variation suppressing method of only correcting variation in a circuit element, only the characteristic of the circuit to be corrected can be corrected. In the case where there are a plurality of circuits, variation detecting means and correcting means have to be provided for each of the circuits. A problem that the circuit area increases occurs.

Although the present invention achieved by the inventors herein has been concretely described on the basis of the embodiments, obviously, the invention is not limited to the foregoing embodiments but can be variously changed without departing from the gist.

What is claimed is:

1. A semiconductor device, comprising:
an oscillation circuit, including a transistor, configured to output a signal having a predetermined frequency; and
a control circuit, coupled to the oscillation circuit, configured to:
output a current set value to set an operation current of the oscillation circuit to a first current value,
obtain first frequency information related to the frequency of the output signal of the oscillating circuit when the operation current is set to the first current value,
output the current set value to set the operation current of the oscillation circuit to a second current value,
obtain second frequency information related to the frequency of the output signal of the oscillation circuit when the operation current is set to the second current value,
obtain manufacture variation information, including a variation amount of a threshold voltage of the transistor, based on a difference between the first and second frequency information, and
correct the current set value used for oscillating operation of the oscillator circuit based on the variation amount of the threshold voltage of the transistor.

2. The semiconductor device according to claim 1, wherein the first frequency information is frequency of the output signal in a state where the operation current is set to the first current value, the second frequency information is frequency of the output signal in a state where the operation current is set to the second current value, and the control circuit corrects the current set value used for oscillation operation of the oscillation circuit on the basis of the frequency difference between first frequency obtained as the first frequency information and second frequency obtained as the second frequency information.

3. The semiconductor device according to claim 1, wherein the oscillation circuit has variable capacitance, frequency of the output signal is set according to a capacitance value of the variable capacitance, the control circuit outputs a capacitance selection value which designates the capacitance value of the variable capacitance and, in a period of obtaining the first frequency information and the second frequency information, the capacitance value of the variable capacitance is set to a value at which frequency of the output signal becomes maximum.

4. The semiconductor device according to claim 1, wherein the oscillation circuit has:
a phase difference comparator which outputs a phase difference detection value having magnitude according to a phase difference between a reference signal and a feedback signal generated from the output signal;
a filter circuit which performs filter process on the phase difference detection value to generate a frequency control value;
an oscillator which controls frequency of the output signal in accordance with the frequency control value;
a switch circuit provided between the filter circuit and the oscillator; and
a frequency divider for dividing frequency of the output signal to generate the feedback signal, and
in a period of obtaining the first and second frequency information, the control circuit sets the switch circuit in an off state to interrupt transmission of the frequency control value to the oscillator.

5. The semiconductor device according to claim 1, wherein the oscillation circuit has variable capacitance, frequency of the output signal is set according to a capacitance value of the variable capacitance, the control circuit outputs a capacitance selection value which designates the capacitance value of the variable capacitance, sets a target value of the frequency of the output signal, makes the oscillation circuit generate the output signal in a state where the operation current is set to the first current value, adjusts the capacitance selection value so that the frequency of the output signal becomes the target value, obtains, as the first frequency information, the capacitance selection value in a state where the frequency of the output signal becomes the target value, makes the oscillation circuit generate the output signal in a state where the operation current is set to the second current value, adjusts the capacitance selection value so that the frequency of the output signal becomes the target value, obtains, as the second frequency information, the capacitance selection value in a state where the frequency of the output signal becomes the target value, and corrects the current set value which is used for the oscillating operation of the oscillation circuit on the basis of a difference value between a first capacitance selection value obtained as the first frequency information and a second capacitance selection value obtained as the second frequency information.

6. The semiconductor device according to claim 1, further comprising a look-up table having table information indicating the relation between the variation amount of the threshold voltage of the transistor and the difference value,
wherein the control circuit obtains the manufacture variation information with reference to the look-up table.

7. The semiconductor device according to claim 6, wherein the look-up table has a plurality of pieces of table information, and the table information used is switched on the basis of temperature information obtained from a temperature sensor formed on a substrate on which the semiconductor device is also formed or from the outside.

8. The semiconductor device according to claim 1, wherein the control circuit increases the current set value by process cycle, sets the frequency of the output signal obtained in a preceding cycle as the first frequency information, sets the frequency of the output signal obtained in a present cycle as the second frequency information and, in the case where second frequency obtained as the second frequency information decreases relative to first frequency obtained as the first frequency information, uses the current set value used in the preceding cycle for the oscillating operation of the oscillation circuit.

9. The semiconductor device according to claim 8, wherein the control circuit sets the current set value to the minimum value of the operation current and performs the first cycle in the process cycles.

10. The semiconductor device according to claim 1, further comprising a counter for measuring frequency of the output signal.

11. The semiconductor device according to claim 1, further comprising a reception circuit performing demodulating process using the output signal which is output from the oscillation circuit, and a transmission circuit performing modulating process using the output signal which is output from the oscillation circuit,
wherein each of the reception circuit and the transmission circuit has a correction circuit which generates a correction signal for the circuit itself on the basis of the manufacture variation information obtained by the control circuit.

12. The semiconductor device according to claim 1, wherein to correct the current set value used for oscillating operation of the oscillator circuit based on the variation amount includes reducing the current set value when the variation amount indicates that the threshold voltage is high and varies.

13. The semiconductor device according to claim 12, wherein to correct the current set value used for oscillating operation of the oscillator circuit based on the variation amount includes increasing the current set value when the variation amount indicates that the threshold voltage is low and varies.

14. A non-transitory computer-readable medium having instructions stored thereon that, when executed by a processor, execute a method for controlling an oscillation circuit, the controlling comprising:
outputting, by a control circuit, a current set value to set an operation current of the oscillation circuit to a first current value,
obtaining first frequency information related to the frequency of the output signal of the oscillating circuit when the operation current is set to the first current value,
outputting the current set value to set the operation current of the oscillation circuit to a second current value,
obtaining second frequency information related to the frequency of the output signal of the oscillation circuit when the operation current is set to the second current value,
obtaining manufacture variation information, including a variation amount of a threshold voltage of a transistor of the oscillation circuit, based on a difference between the first and second frequency information, and
correcting the current set value used for oscillating operation of the oscillator circuit based on the variation amount of the threshold voltage of the transistor.

15. The computer-readable medium according to claim 14, wherein correcting the current set value used for oscillating operation of the oscillator circuit based on the variation amount includes reducing the current set value when the variation amount indicates that the threshold voltage is high and varies.

16. The computer-readable medium according to claim 15, wherein to correct the current set value used for oscillating operation of the oscillator circuit based on the variation amount includes increasing the current set value when the variation amount indicates that the threshold voltage is low and varies.

* * * * *